United States Patent [19]

Okawauchi et al.

[11] Patent Number: 5,541,040
[45] Date of Patent: Jul. 30, 1996

[54] POSITIVE TYPE COLOR LIGHT SENSITIVE MATERIAL AND THE IMAGE FORMING PROCESS THEREFOR

[75] Inventors: Susumu Okawauchi; Yasuo Tosaka; Yoshiyuki Nonaka; Keiichi Hoshino, all of Odawara, Japan

[73] Assignee: Konica Corporation, Tokyo, Japan

[21] Appl. No.: 378,081

[22] Filed: Jan. 25, 1995

Related U.S. Application Data

[62] Division of Ser. No. 106,823, Aug. 16, 1993, abandoned.

[30] Foreign Application Priority Data

Sep. 16, 1992 [JP] Japan .................. 4-246870

[51] Int. Cl.⁶ .............. G03C 7/00; G03C 7/46; G03C 1/46; G03C 1/08
[52] U.S. Cl. ............ 430/378; 430/358; 430/547; 430/502; 430/504; 430/386; 430/387; 430/388; 430/389; 430/505; 430/506; 430/509
[58] Field of Search ............ 430/502, 504, 430/506, 509, 358, 378, 547, 386, 387, 388, 389, 505

[56] References Cited

U.S. PATENT DOCUMENTS

| | | | |
|---|---|---|---|
| 2,592,514 | 4/1952 | Harsh | 430/504 |
| 3,600,180 | 8/1971 | Judd et al. | 96/94 |
| 4,332,885 | 6/1982 | Ohmatsu | 430/509 |
| 4,348,474 | 9/1982 | Scheerer et al. | 430/505 |
| 4,686,174 | 8/1987 | De Keyzer et al. | 430/502 |
| 4,701,404 | 10/1987 | Iijima et al. | 430/509 |
| 4,770,980 | 9/1988 | Matejec et al. | 430/506 |
| 4,806,460 | 2/1989 | Ogawa et al. | 430/504 |
| 4,837,133 | 6/1989 | Kuhn | 430/505 |
| 4,865,964 | 9/1989 | Newmiller | 430/506 |
| 4,902,609 | 2/1990 | Hahm | 430/506 |
| 4,943,518 | 7/1990 | Yoshizawa et al. | 430/506 |
| 4,994,350 | 2/1991 | Ogawa et al. | 430/358 |
| 5,023,169 | 6/1991 | Kirabayashi et al. | 430/556 |
| 5,091,294 | 2/1992 | Nishijima et al. | 430/556 |
| 5,176,990 | 1/1993 | Kim | 430/935 |
| 5,206,124 | 4/1993 | Shimazaki et al. | 430/502 |
| 5,389,506 | 2/1995 | Sutton | 430/506 |
| 5,413,902 | 5/1995 | Hara et al. | 430/502 |
| 5,436,116 | 7/1995 | Hoshino et al. | 430/358 |
| 5,436,117 | 7/1995 | Hoshino et al. | 430/378 |
| 5,457,007 | 10/1995 | Asami | 430/504 |

FOREIGN PATENT DOCUMENTS

| | | |
|---|---|---|
| 2022507 | 7/1970 | France . |
| 6113139 | 9/1981 | Japan . |
| 3-209466 | 9/1991 | Japan . |
| 3-241345 | 10/1991 | Japan . |
| 2172118 | 9/1986 | United Kingdom . |

OTHER PUBLICATIONS

Patent Abstracts of Japan vol. 11, No. 137 (P-572)(2584) 2 May 1987 of JP-A-61 277 957 (Mitsubishi) 8 Dec. 1986 * abstract *.

*Primary Examiner*—Charles L. Bowers, Jr.
*Assistant Examiner*—J. Pasterczyk
*Attorney, Agent, or Firm*—Frishauf, Holtz, Goodman, Langer & Chick. P.C.

[57] ABSTRACT

Disclosed is a positive type color light sensitive material comprising a support having thereon a mainly yellow image forming layer, a mainly magenta image forming layer and a mainly cyan image forming layer;

wherein, when an exposure quantity-gives minimum density of +0.2 on a first layer selected from said three layer after developing in the main spectra sensitivity region of the first layer, a second layer selected from said three layers is given lower density with said exposure than a density without said exposure.

The positive type color light sensitive material is capable of providing a color proof improved in the approximation degrees of an image quality to a printed printer.

11 Claims, 1 Drawing Sheet

POSITIVE TYPE COLOR LIGHT SENSITIVE MATERIAL AND THE IMAGE FORMING PROCESS THEREFOR

This application is a division of application Ser. No. 08/106,823, filed Aug. 16, 1993, (abandoned).

FIELD OF THE INVENTION

This invention relates to a silver halide color photographic light sensitive material suitable for forming a proof-reading color image (or, a color proof) from a plurality of black-and-white half dot images prepared by a color-separation and a half dot image conversion in a color plate-making-.printing process. The invention also relates to a positive type color light sensitive material suitable for preparing a color proof.

BACKGROUND OF THE INVENTION

There have so far been well-known processes for forming a color proof from a plurality of black-and-white half dot images prepared by a color-separation and a half dot image conversion in a color plate-making.printing process. These processes include an over-lay process in which a color image is formed by making use of a photopolymer or a diazo compound, and a surprint process.

The over-lay process has the advantage that the operations are very simple and the production cost is low. The process can be utilized for proofing by superposing four color film sheets (in the primary colors of subtractive color mixture and black). However, this process has a disadvantage that a gloss is produced by superposing the film sheets and, therefore, the resulting texture becomes different from printed matter.

The surprint process is to superpose colored images on a support. This type of process include the well-known processes described in, for example, U.S. Pat. Nos. 3,582,327, 3,607,264 and 3,620,726, in which a colored image is obtained by utilizing the adhesiveness of photopolymeric materials and carrying out a toner development.

There are also the well-known processes as described in Japanese Patent Examined Publication No. 47-27441/1972 and Japanese Patent Publication Open to Public Inspection (hereinafter abbreviated to JP OPI Publication) No. 56-501217/1981, in which a color proof is prepared in the following manner. An image is formed by transferring it onto a support by making use of a light-sensitive colored sheet, by exposing it to light and then by developing it. After that, another colored sheet is laminated thereon and then the same procedures are repeated so as to prepare the color proof.

There is also a-well-known process as described in JP OPI Publication No. 59-97140/1984, in which colored images are obtained by making use of a light-sensitive colored sheet and the corresponding color-separation films are each exposed to light and developed, and the resulting colored images are each transferred onto a support so that a color proof can be formed thereon. The toners for forming the above-mentioned images and the colorants for colored sheets have the advantage that the same coloring materials as printing inks can be used. Therefore, the resulting color proof closely resembles printing in color tone.

However, these processes have the following disadvantages. In the steps for preparing a color proof, images have to be superposed and transferred and it takes a long time to complete the operations and, in addition, the production cost is also expensive.

As for the processes capable of eliminating the above-mentioned disadvantages, there are the processes in which a color proof can be prepared by making use of a silver salt color photographic light sensitive material comprising a white support, such as disclosed in JP OPI Publication Nos. 56-113139/1981, 56-104335/1981, 62-280746/1987, 62-280747/1987, 62-280748/1987, 62-280749/1987, 62-280750/1987 and 62-280849/1987.

In these processes, a proofing image is used in the form of a color image that is formed in the following manner. Plural color-separated black-and-white halftone dot images are prepared by converting a colored original document into plural color-separated halftone dot images. The resulting plural B&W halftone dot images are printed one after another on one sheet of color paper in a contact printing method or the like. The printed images are color developed so that a color image is formed of the dyes produced by the couplers. The resulting color image is to be used as the proofing image.

The above-mentioned technique, however, has the following defects. When the photographic color is approximate printed matter, the density of any black image such as the density of letters is inferior to that of the printed matter. However, when using methods which enhance the black image density to try to approximate the density of the black image such as that of letters to the density of printed matter, the approximation degrees of the color image of the printed matter deteriorate, with the result that it is practically difficult to adjust the densities so that the requirement that both the color and black density approximate printed matter is satisfied.

As for the technique for reducing the above-mentioned defects, there is a well-known technique in which the 4th black printer layer having a spectral sensitivity different from any other layers is arranged, besides the yellow, magenta and cyan color developing layers. This technique is effective as far as an image approximate to a printed matter can be obtained. However, the following problems are raised in this method. Because a black printer layer is added, the total emulsion layer is increased in thickness; half tone dot image reproducibility is caused by sharpness deterioration; physical properties such as curling resistance, deteriorate; manufacturing costs are increased; and the number of processing steps are increased when the black printer layer is separately exposed.

SUMMARY OF THE INVENTION

It is an object of the invention to provide a color proof improved in the approximation degrees of image quality to printed matter, when the color proof is prepared by making use of a silver halide color photographic light sensitive material (hereinafter sometimes abbreviated to a color light sensitive material) and based on the information of plural black-and-white halftone dot images prepared by color separations and halftone dot image conversions.

Another object of the invention is to provide a color proof that has the photographic color image hues and black background which approximate printed matter, and that is excellent in white background and halftone dot quality.

A further object of invention is to provide a color proof that has the separated color hues and black background which approximate printed matter, and that can be prepared also directly from an image data digitally stored.

DESCRIPTION OF THE REFERENTIAL NUMERALS

Figure 1:
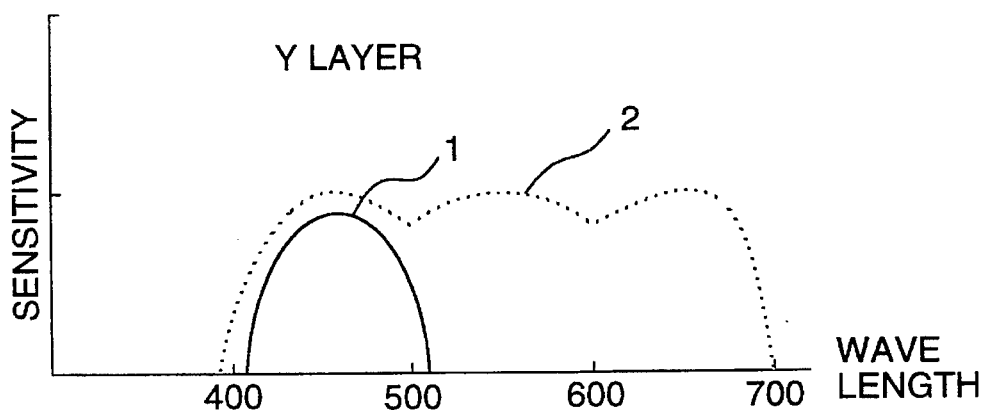
FIGS. 1A, 1B and 1C are graphs of the spectral sensitivities of three layers of an example of the embodiments of the invention.
Figure 1:
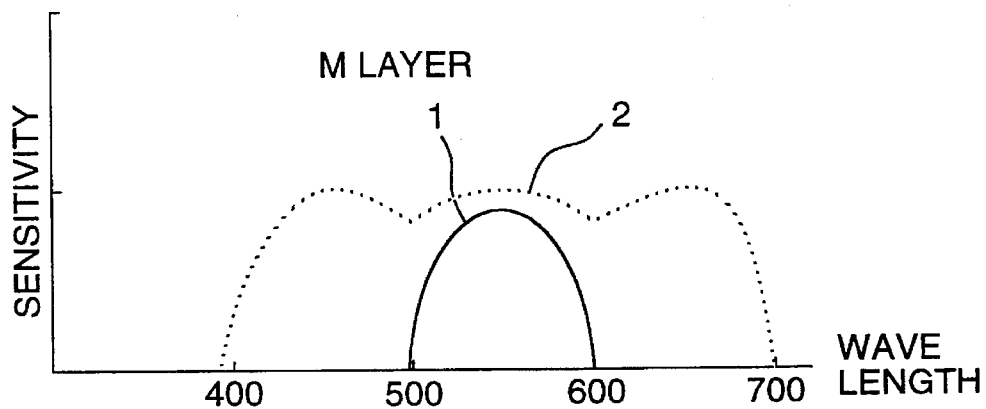
Figure 1:
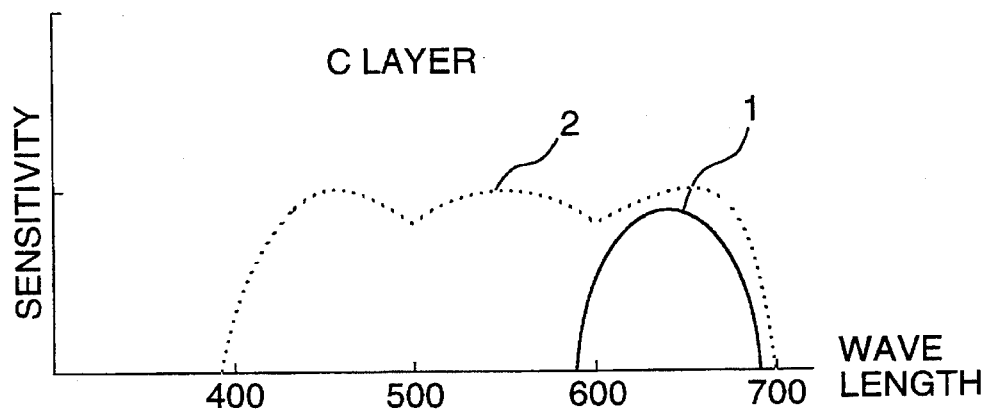

1 is the spectral sensitivity of the emulsion having the main spectral sensitivity region, and

2 is the spectral sensitivity of the emulsion having the region sensitive to blue, red and green.

DETAILED DESCRIPTION OF THE PREFERRED EMBODIMENT

The above-mentioned objects of the invention can be achieved in the following constitution.

(1) A positive type color light sensitive material which comprises a layer mainly forming a yellow image, another layer mainly forming a magenta image and a further layer mainly forming a cyan image; wherein, when two layers arbitrarily selected from the three layers are named layer 1 and layer 2 respectively and an exposure is made in the main spectral sensitivity region of layer 1 and in an exposure quantity capable of giving a density of the minimum density +0.2 to the image density on layer 1, then, the light sensitive material has at least one combination of layers that the image density on layer 2 is lower than the density obtained when the exposure is not made, but the development is made.

(2) A positive type color light sensitive material which comprises a layer mainly forming a yellow image, another layer mainly forming a magenta image and a further layer mainly forming a cyan image; wherein, when two layers arbitrarily selected from the three layers are served as layer 1 and layer 2 respectively, and an exposure is made in the main spectral sensitivity region of layer 1 and in one half of an exposure quantity capable of giving a density of the minimum density +0.2 to the image density on layer 1, then, the light sensitive material has at least one combination that the image density on layer 2 is lower than the density obtained when the exposure is not made, but the development is made.

(3) A positive type color light sensitive material which comprises a layer mainly forming a yellow image, another layer mainly forming a magenta image and a further layer mainly forming a cyan image, each having a different spectral sensitivity region; wherein at least one of the three layers has the sensitivities not only in the main spectral sensitivity region of its own but also in the main spectral sensitivity regions of the other two layers; and, when an exposure is made in the main spectral sensitivity region of the very layer, a minimum dye density can be given, and when an exposure is made in the main spectral sensitivity regions of the other layers, a dye density can be given within the range of 50 to 97% of the dye density in an unexposed area.

(4) The positive type color light sensitive material as mentioned above (2), wherein the main spectral sensitivity region of the layer mainly forming a yellow image is a blue-light region, the main spectral sensitivity region of the layer mainly forming a magenta image is a green-light region, and the main spectral sensitivity region of the layer mainly forming a cyan image is a red-light region.

(5) A positive type color light sensitive material which comprises a layer mainly forming a yellow image and containing not less than two different silver halide emulsions, another layer mainly forming a magenta image and containing not less than two different silver halide emulsions, and a further layer mainly forming a cyan image and containing not less than two different silver halide emulsions; wherein, when two kinds of the silver halide emulsions selected from those contained in the yellow image forming layer are named Emulsions 1 and 2, two of those contained in the magenta image forming layer are named Emulsions 3 and 4, and two of those contained in the cyan image forming layer are named Emulsions 5 and 6, respectively, Emulsions 1, 3 and 5 have each the different main spectral sensitivity regions and Emulsions 2, 4 and 6 have each almost the common spectral sensitivity region other than an infrared spectral region.

(6) An image forming process characterized in that at least one original document selected from the group consisting of those for forming yellow images, those for forming magenta images, those for forming cyan images and those for forming black images each formed on a transparent support, the above-mentioned at least one original document is brought into close contact with a positive type color light sensitive material comprising a layer mainly forming a yellow image, another layer mainly forming a magenta image and a further layer mainly forming a cyan image; and that, when two layers respectively named layer 1 and layer 2 are arbitrarily selected from the three layers, and an exposure is made in the main spectral sensitivity region of layer 1 and in an exposure quantity capable of giving a density of the minimum density +0.2 to the image density on layer 1, then, the light sensitive material has at least one combination that the image density on layer 2 is lower than the density obtained when the exposure is not made, but the development is made;

that an exposure is made from the original document side; and that the exposed light sensitive material is developed.

(7) An image forming process wherein a positive type color light sensitive material which comprises a layer mainly forming a yellow image, another layer mainly forming a magenta image and a further layer mainly forming a cyan image; and that, when two layers respectively named layer 1 and layer 2 are arbitrarily selected from the three layers and an exposure is made in the main spectral sensitivity region of layer 1 and in an exposure quantity capable of giving a density of the minimum density +0.2 to the image density on layer 1, then, the light sensitive material has at least one combination of layers that the image density on layer 2 is lower than the density obtained when the exposure is not made, but the development is made; the above-mentioned light sensitive material is exposed to light according to at least one signal processed by separating the image information into a yellow, magenta, cyan and black image information, respectively; and wherein the exposed light sensitive material is developed.

(8) The positive type color light sensitive material as mentioned above (1), wherein at least one layer selected from the group consisting of the mainly yellow image forming layer, a mainly magenta image forming layer and a mainly cyan image forming layer, the above-mentioned at least one layer contains not less than two different kinds of silver halide emulsions; and the layer containing not less than two different kinds of the silver halide emulsions is prepared by applying a coating solution prepared by mixing, immediately before the coating, at least one emulsion selected from the silver halide emulsions contained in the layer with a solution containing other emulsions.

Now, the invention will be further detailed below.

In the invention, the term, "a mainly yellow image forming layer (hereinafter sometimes referred to as a yellow layer)" means a layer of which the dye image absorption has at least one absorption maximum within the range of 420 nm to 490 nm and the absorption at 450 nm is at least not less than 1.5 times as much as the absorption at 550 nm or 650 nm, when an image is formed on the layer. In the invention, the mainly yellow image forming layer is also allowed to contain any auxiliary image forming dye, besides the yellow image forming dye.

In the invention, the term, "a mainly magenta image forming layer (hereinafter sometimes referred to as a magenta layer)" means a layer of which the dye image absorption has at least one absorption maximum within the range of 520 nm to 590 nm and the absorption at 550 nm is at least not less than 1.5 times as much as the absorption at 450 nm or 650 nm, when an image is formed on the layer. In the invention, the mainly magenta image forming layer is also allowed to contain any auxiliary image forming dye, besides the magenta image forming dye.

In the invention, the term, "a mainly cyan image forming layer (hereinafter sometimes referred to as a cyan layer)" means a layer of which the dye image absorption has at least one absorption maximum within the range of 620 nm to 690 nm and the absorption at 650 nm is at least not less than 1.5 times as much as the absorption at 450 nm or 550 nm, when an image is formed on the layer. In the invention, the mainly cyan image forming layer is also allowed to contain any auxiliary image forming dye, besides the cyan image forming dye.

The yellow, magenta and cyan images of the invention may also be the dye images formed in a color development, the diffusion transfer images or the dye images formed in a silver dye bleaching process.

In the invention, the mainly yellow image forming layer, mainly magenta image forming layer and mainly cyan image forming layer are combined with silver halides each having the different spectral sensitivity wavelength regions. In some wavelength in the spectral sensitivity wavelength regions of the layers, the silver halide is to have a spectral sensitivity preferably at least 4 times and particularly at least 8 times as much as each of the spectral sensitivities of other layers. In the invention, the term, "a main spectral sensitivity region", means the above-mentioned each of the different spectral sensitivity wavelength regions. An exposure can be made by utilizing a light source having its spectral energy distribution within the above-mentioned wavelength region.

In the invention, it is preferable that a layer mainly forming a yellow image, another layer mainly forming a magenta image and a further layer mainly forming a cyan image are each arranged; and that, when two layers respectively named layer 1 and layer 2 are arbitrarily selected from the three layers, and an exposure is made in the main spectral sensitivity region of layer 1 and in an exposure quantity capable of giving a density of the minimum density +0.2 to the image density on layer 1, then, there is at least one combination that the image density on layer 2 is lower than the density obtained when the exposure is not made, but the development is made.

The silver halide color photographic light sensitive materials of the invention include, preferably, a positive type color light sensitive material comprising a support bearing thereon a mainly yellow image forming layer, a mainly magenta image forming layer and a mainly cyan image forming layer, wherein, when any two layers out of the three layers are named layers 1 and 2 and an exposure is made in the main spectral sensitivity region of layer 1 and in one half of an exposure quantity giving a density of the minimum density + 0.2 to the image density of layer 1 and a development is made, then the light sensitive material has at least one combination that image density of layer 2 is lower than the density obtained when the exposure is not made, but the development is made.

As for one of the concrete examples for the illustration, layer 1 is set to be a mainly magenta image forming layer containing a green-sensitive silver halide emulsion and layer 2 is set to be a mainly cyan image forming layer containing a red-sensitive silver halide emulsion. When an exposure is made to green exposure light in the main light-sensitive wavelength region of layer 1 by changing the exposure quantity, it is possible to determine an exposure quantity in which the green density of the main magenta image shows a green density of 0.2 above the minimum density. In this exposure quantity, the red density of the main cyan image of layer 2 is lower than the red density of the main cyan image of layer 2 obtained by a development without making any exposure to light. The range of lowering the red density of layer 2 is, preferably, not less than 0.05 in terms of density and, particularly, not less than 0.10. There is no special limitation to the lower limit, but the lowering range thereof is, preferably, less than 0.7 and, particularly, less than 0.5. From the viewpoint of the density lowering ratio, it is preferable to be within the range of 50% to 97%.

The image densities of layers 1 and 2 can be measured in the following manner.

First, the method for measuring the image densities of each image forming layer will be described below. The blue-, green- and red-light components of the images formed each on the respective image forming layers can be known in advance by measuring the blue-, green- and red-light densities of a subject light sensitive material after developed. Therefore, the densities of the images formed on the respective image forming layer can be obtained, provided that the color light components are comprised of the combination of the imaging dyes. In the above-mentioned manner, the densities of the main images of each image forming layer can be obtained by the above-mentioned measurements. In some image formed on an image forming layer, the blue-, green- and red-light components thereof can be obtained by exposing other images to light one after another under the combination of the following exposure conditions A to C, and then by developing them. To be more concrete, in the above-given example, for example, the descriptions will be made about the measurement of the image density of a yellow image forming blue-sensitive silver halide emulsion layer. The main yellow image of the yellow image forming layer can be obtained by exposing it to light under the exposure conditions B and C in order and then by developing it. By measuring the density of the resulting yellow image by making use of a densitometer, the blue-, green- and red-light density components of the dye image formed on the yellow image forming layer can be obtained. Besides the above, each of the color components of the dye image formed on the magenta and cyan image forming layers can also be obtained in the same manner.

(Exposure conditions A) When an exposure is made to light having a wavelength within the main spectral sensitivity region of the mainly yellow image forming layer of a light sensitive material, by changing the exposure quantity and in the minimum exposure quantity so that the blue light density of the main yellow image can be minimized after completing the development.

(Exposure conditions B) When an exposure is made to light having a wavelength within the main spectral sensitivity region of the mainly magenta image forming layer of a light sensitive material, by changing the exposure quantity and in the minimum exposure quantity so that the green light density of the main magenta image can be minimized after completing the development.

(Exposure conditions C) When an exposure is made to light having a wavelength within the main spectral sensitivity region of the mainly cyan image forming layer of a light sensitive material, by changing the exposure quantity and in the minimum exposure quantity so that the red light density of the main cyan image can be minimized after completing the development.

As for the color light sensitive materials of the invention, any light sensitive materials can be used, provided that they are any one of the silver halide color photographic light sensitive materials each capable of forming positive type images. To give an example applicable thereto, it is allowed to use a direct positive type silver halide color photographic light sensitive material-capable of producing a color dye upon coupling with the oxidized products of a color developing agent. Another preferable example is a reversal type light sensitive material capable of forming a positive image in a reversal treatment. A further example preferably applicable thereto is a silver dye bleaching type light sensitive material. In the invention, the yellow, magenta and cyan layers are each to have the different main spectral sensitivities, respectively.

The emulsions each having the different main spectral sensitivity regions, which are to be contained in yellow, magenta and cyan layers, are herein named Emulsions Y, M and C, respectively. In the invention, it is preferable that any one of the yellow, magenta and cyan layers contains Emulsion P that has a spectral sensitivity in the main spectral sensitivity regions of the layer subject to contain Emulsion P. Emulsion P has also a spectral sensitivity in the main spectral sensitivity region of at least either one layer of the two layers other than the layer subject to contain Emulsion P.

In the invention, Emulsion P is to be contained, preferably, in at least one of the yellow, magenta and cyan layers and, particularly, in each of the yellow, magenta and cyan layers. In the latter case, Emulsions P which are to be contained in the yellow, magenta and cyan layers may be the same with or different from each other.

When Emulsion P is contained in the yellow layer, Emulsion P has not only a spectral sensitivity in the main spectral sensitivity region of the yellow layer, but also another spectral sensitivity in at least one of the main spectral sensitivity regions of the magenta and cyan layers. It is preferable that Emulsion P has the spectral sensitivities in both main spectral sensitivity regions of the magenta and cyan layers.

When Emulsion P is contained in the magenta layer, Emulsion P has not only a spectral sensitivity in the main spectral sensitivity region of the magenta layer, but also another spectral sensitivity in at least one of the main spectral sensitivity regions of the yellow and cyan layers. It is preferable that Emulsion P has the spectral sensitivities in both main spectral sensitivity regions of the yellow and cyan layers.

When Emulsion P is contained in the cyan layer, Emulsion P has not only a spectral sensitivity in the main spectral sensitivity region of the cyan layer, but also another spectral sensitivity in at least one of the main spectral sensitivity regions of the yellow and magenta layers. It is preferable that Emulsion P has the spectral sensitivities in both main spectral sensitivity regions of the yellow and magenta layers.

For example, when Emulsion P is mixed in Emulsion Y and an exposure is made to light having a wavelength within the spectral sensitivity region of the yellow layer, the sensitivity ratio of Emulsion Y to Emulsion P is preferably within the range of $1/10$ to 10. Similarly to the above, when an exposure is made to light having a wavelength within the spectral sensitivity region of Emulsion M, the sensitivity ratio of Emulsion M to Emulsion P is preferably within the range of $1/10$ to 10. Similarly to the above, when an exposure is made to light having a wavelength within the spectral sensitivity region of Emulsion C, the sensitivity ratio of Emulsion C to Emulsion P is preferably within the range of $1/10$ to 10.

In one of the preferable embodiments of the invention, the yellow layer contains a blue-sensitive silver halide emulsion, the magenta layer contains a green-sensitive silver halide emulsion, and cyan layer contains a red-sensitive silver halide emulsion, respectively. The above-mentioned yellow layer is further mixed with a silver halide emulsion having the sensitivities to blue-, green- and red-rays of light. Similarly to the above, the above-mentioned magenta and cyan layers are each mixed with a silver halide emulsion having the sensitivities to blue-, green- and red-rays of light, respectively.

In another preferable embodiment of the invention, the yellow layer contains a green-sensitive silver halide emulsion, the magenta layer contains a red-sensitive silver halide emulsion, and cyan layer contains an infrared-sensitive silver halide emulsion, respectively. The above-mentioned yellow layer is further mixed with a silver halide emulsion having the sensitivities to green-, red-and infrared-rays of light. Similarly to the above, the above-mentioned magenta and cyan layers are each mixed with a silver halide emulsion having the sensitivities to green-, red- and infrared-rays of light, respectively.

In a further preferable embodiment of the invention, the yellow layer contains a blue-sensitive silver halide emulsion, the magenta layer contains a green-sensitive silver halide emulsion, and cyan layer contains a red-sensitive silver halide emulsion, respectively. The above-mentioned yellow and cyan image forming layers each are further mixed with a silver halide emulsion having the sensitivities to blue, green- and red-rays of light.

Besides the above-mentioned combinations, the color sensitivities of the silver halide emulsions can freely be selected in the yellow, magenta and cyan layers. Any combinations can be taken, provided that the color sensitivities thereof are different from each other. The yellow, magenta and cyan layers contain the silver halide emulsions each having the different spectral sensitivities, respectively, and at least one of the yellow, magenta and cyan layers contains not only an emulsion having a sensitivity in the main spectral sensitivity region, but also another emulsion having the sensitivities in the main spectral sensitivity regions of the other two layers. For example, the yellow layer may contain an infrared-sensitive emulsion, the magenta layer may contain a red-sensitive emulsion and the cyan layer may contain both of a green-sensitive emulsion and an emulsion having the color sensitivities to red- and green-light.

A silver halide emulsion (named Emulsion P) having a spectral sensitivity in partially common with the spectral sensitivities of the yellow, magenta and cyan image forming silver halide emulsions of the invention; the Emulsion P can be materialized by selecting spectrally sensitizing dyes. For example, an emulsion Sensitive to all of blue-, green- and red-rays of light can be prepared, for example, by making combination use of blue-, green- and red-sensitizing dyes.

It is preferable that at least one of the yellow, magenta and cyan layers each relating to the invention contains not less than two different kinds of silver halides. It is preferable that the layer containing not less than two different kinds of silver halides is formed of a coating solution prepared by mixing, immediately before a coating is made, at least one emulsion selected from the silver halide emulsions contained in the layer and a solution containing the other kind of emulsion The expression, "immediately before a coating is made", herein means a point of time within 5 minutes, preferably within 2 minutes and, particularly within 1 minute, before coating.

When exposing a light sensitive material of the invention to light, at least one original document selected from the group consisting of those for forming yellow images, those for forming magenta images, those for forming cyan images and those for forming black images each formed on the transparent support of the light sensitive material; the above-mentioned at least one original document is brought into close contact with the light sensitive material and an exposure is made from the original documents side, then it can be developed.

When exposing a light sensitive material of the invention to light, the light sensitive material is exposed to light according to at least one signal processed by separating the image information into a yellow, magenta, cyan and black image information, respectively.

As for the silver halide emulsions applicable to the invention, any silver halide emulsions can be used, provided that a positive type image can be formed as a developed image. It is also allowed to use a silver halide emulsion with which a negative silver image can be formed by developing it with a surface latent image forming type silver halide emulsion that is capable of forming a latent image on the surface thereof upon imagewise exposing it to light. It is further allowed to preferably use those with which a direct positive image can be obtained, either in a series of process of making use of an internal latent image forming type silver halide emulsion of which the grains are not fogged in advance, making a fogging treatment (that is a granulation treatment) after completing an imagewise exposure, and then carrying out a surface development, or in another series of process of making an imagewise exposure and then carrying out a surface development while making a fogging treatment.

The above-mentioned fogging treatment can be carried out by any one of the treatments such as a flood exposure, a foggant as a chemically fogging agent, a high energy developer, or a heat treatment. The above-mentioned "internal latent image forming type silver halide emulsion" herein means an emulsion having photosensitive nuclei mainly inside of the silver halide crystal grains thereof, and containing silver halide grains which can form a latent image thereinside when they are exposed to light.

In the technical field of the above-mentioned internal latent image forming type direct positives, a variety of techniques have be known so far. For example, the techniques include those described in U.S. Pat. Nos. 2,592,250, 2,466,957, 2,497,875, 2,588,982, 3,761,266, 3,761,276 and 3,796,577, British Patent No. 1,151,363, and so forth.

The mechanism for forming a positive image has not definitely apparent. However, for example, the following descriptions are found in 'Photographic Science and Engineering', Vol.20, p.158, (1976).

Photoelectrons produced in silver halide crystal grains by making an imagewise exposure are captured selectively in the grains, so that an internal latent image can be formed. The resulting internal latent image can work as an effective capture center to the electrons present in a conduction band. Therefore, the electrons injected thereafter in a fogging development process are captured inside the grains exposed to light, so that the latent image can be intensified. In this case, the latent image cannot be developed in any surface development, because the latent image is captured inside the grains. On the other hand, at least one part of the electrons injected is captured on the surfaces of the grains not subjected to any imagewise exposure, so that a latent image is formed thereon. Therefore, the grains are developed in a surface development.

The internal latent image forming type silver halide grains unfogged in advance, which are applicable to the invention; such grains are formed into an emulsion comprising silver halide grains having most of the photosensitive nuclei inside the grains so that a latent image can mainly be formed inside the silver halide grains. These emulsions can each contain any silver halides including, for example, silver bromide, silver chloride, silver chlorobromide, silver chloroiodide, silver iodobromide, silver chloroiodobromide and so forth.

Among the above-mentioned emulsions, a preferable emulsion is as follows. A part of a sample is coated on a transparent support so that the silver coating weight thereof can be within the range of about 1 to 3.5 $g/m^2$. The part of the sample is exposed to light, through a light intensity scale, for a certain time from about 0.1 seconds to about 1 second. The exposed sample is developed, at 20° C. for 4 minutes, by making use of the following surface developer A capable of developing only the images on the surfaces of the grains not substantially containing any silver halide solvent. In this case, the maximum density of the resulting developed sample is not higher than one fifth of the maximum density obtained when another part of the same emulsion sample is exposed to light in the same manner as above and is then developed, at 20° C. for 4 minutes, by making use of the following internal developer B capable of developing the images inside the grains. In a particularly preferable emulsion, the maximum density obtained by making use of surface developer A is not higher than one tenth of the maximum density obtained by making use of internal developer B.

| (Surface developer A) | |
| --- | --- |
| Metol | 2.5 g |
| L-ascorbic acid | 10.0 g |
| Sodium metaborate (tetrahydrate) | 35.0 g |
| Potassium bromide | 1.0 g |
| Add water to make | 1000 ml |
| (Internal developer B) | |
| Metol | 2.0 g |
| Sodium sulfite (anhydrate) | 90.0 g |
| Hydroquinone | 8.0 g |
| Sodium carbonate (monohydrate) | 52.5 g |
| Potassium bromide | 5.0 g |
| Potassium iodide | 0.5 g |
| Add water to make | 1000 ml |

The internal latent image forming type silver halide emulsions preferably applicable to the invention include those prepared in various processes. For example, a conversion type silver halide emulsion, such as those described in U.S. Pat. No. 2,592,250; a silver halide emulsion comprising silver halide grains treated in an internal chemical sensitization, such as those described in U.S. Pat. Nos. 3,206,316, 3,317,322 and 3,367,778; an emulsion comprising silver halide grains incorporated polyvalent metal ions thereinto, such as those described in U.S. Pat. Nos. 3,271,157, 3,447,927; a silver halide emulsion chemically sensitized slightly on the surfaces of the silver halide grains containing a doping agent, such as those described in U.S. Pat. No. 3,761,276; a silver halide emulsion comprising the grains having a multilayered structure, such as those described in JP OPI Publication Nos. 50-8524/1975, 50-38525/1975 and 53-2408/1978; and, besides, a silver halide emulsion such as those described in JP OPI Publication Nos. 52-156614/1977 and 55-127549/1980.

The internal latent image forming type silver halide grains preferably applicable to the invention may be comprised of silver halides having any silver halide compositions, such as silver bromide, silver chloride, silver chlorobromide, silver chloroiodide, silver iodobromide and silver chloroiodobromide. Among them, the grains containing silver chloride are excellent in developability and suitable for rapid processing treatments.

The silver halide grains applicable to the invention may have any configurations, such as a cube, an octahedron, a tetradecahedron comprising the mixtures of (100) faces and (111) faces, a form having (110) faces, a sphere, and a tablature. The grains may preferably be used when they have an average grain size within the range of 0.05 to 3 μm. Concerning the grain size distribution of the grains, they may be either monodisperse type emulsion grains uniform in crystal habit or emulsion grains irregular in grain size and crystal habit. Among the emulsions, the above-mentioned monodisperse type emulsions uniform in grain size and crystal habit are preferable. In the invention, the term, 'a monodisperse type silver halide emulsion', herein-means an emulsion, provided that, when the contents by weight of the silver halide grains having the grain sizes within the range of ±20% of the average grain size rm are not less than 60%, preferably 70% and, particularly 80% of the total contents by weight of the silver halide grains The term, 'an average grain size rm', is herein defined as a grain size $ri$ obtained when the product, $ni \times ri^3$, of a frequency $ni$ of the grains having a grain size $ri$ and $ri^3$, is maximized, (provided therein that the significant figures are three columns and the lowest column is rounded) The term, 'a grain size', herein means a grain diameter in the case of spherical silver halide grains, and a diameter obtained when the projective image of a grain is converted into a circular image having the same area as that of the projective image in the case of any other grains other than the spherical grains. The grain sizes can be obtained in the following manner, for example. A gain is magnified 10,000 to 50,000 times larger through an electron microscope and is then photographed, and the diameter or projected area of the grain is practically measured on the resulting photoprint, (provided therein that the numbers of the grains subject to the measurement are not less than 1,000 at random.)

In the particularly preferable highly monodisperse type emulsions, the grain size distributions thereof defined by the following formula are not higher than 20%.

(Standard grain size deviation/Average grain size)×100 =Grain size distribution (%)

wherein the average grain sizes and the standard grain size deviations are to be obtained from the aforementioned definition of ri.

The above-mentioned monodisperse type emulsions can be prepared by adding an aqueous silver salt solution and a water-soluble halide solution into a gelatin solution containing seed grains, under the controls of pAg and pH, in a double-jet precipitation process. For determining the adding rate, the techniques described in JP OPI Publication Nos. 54-48521/1979 and 58-49938/1983 may be cited. As for the processes for preparing a further highly monodisperse type emulsion, it is allowed to apply the process for growing an emulsion in the presence of a tetrazaindene compound, which is disclosed in JP OPI Publication No. 60-122935/1985.

In the silver halide photographic light sensitive materials relating to the invention, the grain sizes of each of the emulsion layers thereof can be determined from the wide ranges thereof, by taking variously required characteristics into consideration, including particularly sensitivities, sensitivity balance, color-separability, image sharpness and graininess.

In one of the preferable embodiments of the invention, the silver halide grain sizes preferably applicable thereto are within the range of 0.1 μm to 0.6 μm for the red-sensitive emulsions, 0.15 μm to 0.8 μm for the green-sensitive emulsions and 0.3 μm to 1.2 μm for the blue-sensitive emulsions, respectively.

There is no special limitation to the grain sizes of the aforementioned Emulsion P relating to the invention, However, the average grain sizes thereof have each a ratio within the range of 0.4 to 3.0 and, preferably, 0.7 to 2.0 to the largest average grain size among those of Emulsions Y, M and C.

The yellow, magenta and cyan image forming layers of the invention are each multicoated on a support. However, they may be coated in any order from the support side. In one of the preferable embodiments, for example, the magenta, cyan and yellow image forming layers are multicoated in this order from the support side. Besides the image forming layers, an intermediate layers, filter layers, protective layers and so forth may also be arranged, if required.

The silver halides to be used in the invention can be optically sensitized by any common sensitizing dyes. It is also useful, for the silver halide emulsions of the invention, to make combination use of the sensitizing dyes applicable to the supersensitization of internal latent image forming type silver halide emulsions and negative type silver halide emulsions. About the sensitizing dyes, Research Disclosure (hereinafter abbreviated to RD), Nos. 15162 and 17643, may be cited.

Among the silver halide photographic light sensitive materials of the invention, a preferable silver halide color photographic light sensitive material is as follows. After completing a photographic process including a color developing step and in the solid monochromatic yellow, magenta and cyan areas (having a halftone dot ratio of 100%) of the yellow, magenta and cyan image forming layers, the maximum densities of the solid areas thereof are each within the range of 1.50 to 1.90, respectively, and the densities of the yellow, magenta and cyan color components of the black color, corresponding to the solid image areas of the black printer (having a halftone dot ratio of 100%), are not lower than 1.90, respectively.

In forming an internal latent image forming type direct positive image preferably applicable to the invention, a fogging treatment can be performed by making a flood exposure or by making use of a compound capable of fogging nuclei, that is a so-called foggant.

The above-mentioned flood exposure is carried out by making a uniform exposure overall, after dipping or wetting an imagewise exposed light sensitive material in a developer or other aqueous solution. The light sources applicable thereto may be any one, provided that the light source can emit the light having the same photosensitive wavelength region as that of the above-mentioned light sensitive material. High illuminance light such as flash light can also be used for a short time, or weak light may further be used for a long time. The flood exposure time may be widely changed according to the above-mentioned photographic light sensitive materials, development conditions, light sources and so forth so that the best positive images can finally be obtained. It is most preferable to give a flood exposure quantity within a certain range according to the combination with the subject light sensitive material. When giving an excessive exposure quantity, it usually tends to increase the minimum density or to induce a desensitization, so that image qualities are deteriorated.

Now, the foggants preferably applicable to the invention will be detailed below.

As for the foggants applicable to the invention, a wide variety of compounds can be used. The foggants may be made present in the course of carrying out a development. For example, the foggants may be contained in the component layers of a photographic light sensitive material other than the support thereof, (among the layers, the silver halide emulsion layers are particularly preferable.). The foggants may also be contained in a developer of a solution to be used in advance of the developing step. The amount of the foggant used therein may be widely changed to meet the requirements. The amount thereof used is within the range of 1 to 1,500 mg and preferably 10 to 1,000 mg when adding it into a silver halide emulsion layer, and within the range of 0.01 to 5 g/liter and preferably 0.05 to 1 g/liter when adding it into a processing solution such as a developer.

The foggants applicable to the invention include, for example, hydrazines given in U.S. Pat. Nos. 2,563,785 and 2,588,982; hydrazide or hydrazine compounds given in U.S. Pat. No. 3,227,552; heterocyclic quaternary nitrogen salt compounds given in U.S. Pat. Nos. 3,615,615, 3,718,479, 3,719,494, 3,734,738 and 3,759,901; and the compounds having an adsorption group to silver halide surfaces, such as acylhydrazinophenylthio ureas given in U.S. Pat. No. 4,030,925. These foggants may also be used in combination. For example, the foregoing RD describes that a non-adsorption type foggant is used with an adsorption type foggant in combination. This combination technique is also effective in embodying the invention. As for the foggants applicable to the invention, any one of those of the adsorption type and the non-adsorption type can be used and the combinations thereof can also be used.

The typical examples of the useful foggants may be given as follows. Namely, hydrazine compounds including hydrazine hydrochloride, 4-methylphenyl hydrazine hydrochloride, 1-acetyl-2-phenyl hydrazine, 1-formyl-2-(4-methylphenyl) hydrazine, 1-methylsulfonyl-2-phenyl hydrazine, 1-methylsulfonyl-2-(3-phenylsulfonamidophenyl) hydrazine, 1-benzoyl-2-phenyl hydrazine and formaldehydephenyl hydrazine; N-substituted quaternary cycloammonium salts including 3-(2-formylethyl) -2-methylbenzothiazolium bromide, 3-(2-acetylethyl)-2-benzyl-5-phenylbenzoxazolium bromide, 3-(2-acetylethyl)-2-benzylbenzoselenazolium bromide, 2-methyl-3-[3-(phenyl hydrazino)propyl] benzothiazolium bromide, 1,2-dihydro-3-methyl-4-phenylpyrido[2,1-b]benzothiazolium bromide, 1,2-dihydro-3-methyl-4-phenylpyrido[2,1-b]benzoselenazolium bromide and 4,4'-ethylene bis(1,2-dihydro-3-methylpyrido [2,1-b]benzothiazolium bromide; 5-(3-ethyl-2-benzothiazolinidene)-3-[4-(2-formyl hydrazino)phenyl]rhodanine, 1,3-bis[4-(2-formyl hydrazino)phenyl]thiourea, 7-(3-ethoxythiocarbonylamino benzamido)-9-methyl-10-propargyl-1,2,3,4-tetrahydroacridinium trifluoromethane sulfonate and 1-formyl-2-[4-{3-(2-methoxyphenyl)ureido}phenyl]hydrazine.

When the photographic light sensitive materials each comprising the silver halide emulsion layers relating to the invention are exposed imagewise and are then exposed to light or developed in the presence of a foggant, direct positive images can be formed.

As for the developing agents applicable to the developers for developing the photographic light sensitive materials relating to the invention, the typical examples thereof may be given as follows. Namely, common silver halide developing agents including polyhydroxybenzenes such as hydroquinone, aminophenols, 3-pyrazolidones, ascorbic acid and the derivatives thereof, reductones, phenylenediamines, or the mixtures thereof. The concrete examples thereof may further be given as follows. Namely, hydroquinone, aminophenol, N-methyl aminophenol, 1-phenyl-3-pyrazolidone, 1-phenyl-4,4-dimethyl-3-pyrazolidone, 1-phenyl-4-methyl-4-hydroxymethyl-3-pyrazolidone, ascorbic acid, N,N-diethyl-p-phenylenediamine, diethylamino-o-toluidine, 4-amino-3-methyl-N-ethyl-N-($\beta$-methanesulfonamidoethyl)aniline, 4-amino-3-methyl-N-ethyl-N-($\beta$-hydroxyethyl)aniline, 4-amino-N-ethyl-N-($\beta$-hydroxyethyl)aniline, 4-amino-3-methyl-N-ethyl-N-($\gamma$-hydroxypropyl)aniline, and so forth. It is also allowed that the above-given developing agents may be contained in an emulsion in advance so that the developing agents can work on silver halides when they are dipped in an aqueous high pH solution.

The developers applicable to the invention may further contain a specific antifoggant and a development inhibitor, or these additives to developers can also be optionally incorporated into the component layers of photographic light sensitive materials.

The silver halide photographic light sensitive materials of the invention can be applied with any known photographic additives.

The well-known photographic additives include, for example, the following compound given in Research Disclosures RD 17643 and RD 18176.

|  | RD 17643 | | RD 18716 | |
| --- | --- | --- | --- | --- |
| Additives | Page | Group | Page | Group |
| Chemical sensitizer | 23 | III | 648 | Upper right |
| Sensitizing dye | 23 | IV | 648 | Upper right |
| Development inhibitor | 29 | XXI | 648 | Upper right |
| Antifoggant | 24 | VI | 649 | Lower right |
| Stabilizer | 24 | VI | 649 | Lower right |
| Color stain preventive | 25 | VII | 650 | Left-right |
| UV abosorbent | 25~26 | VII | 649 R~650 L | |
| Filter dye | 25~26 | VII | 649 R~650 L | |
| Whitening agent | 24 | V | | |
| Hardener | 26 | X | 651 R | |
| Coating aid | 26~27 | XI | 650 R | |
| Surfactant | 26~27 | XI | 650 R | |
| Plasticizer | 27 | XII | 650 R | |
| Lubricant | 27 | XII | 650 R | |
| Antistatic agent | 27 | XII | 650 R | |
| Matting agent | 28 | XVI | 650 R | |
| Binder | 29 | IX | 651 R | |

The emulsion layers of the light sensitive materials relating to the invention can be applied each with a dye forming coupler capable of producing a dye upon making a coupling reaction with the oxidized products of a color developing agent. The dye forming couplers are usually selected respectively to be able to produce dyes capable of absorbing the rays of light having the photospectral sensitivities of the corresponding emulsion layers. That is to say, a yellow dye forming coupler is applied to a blue-sensitive emulsion layer; a magenta dye forming coupler, to a green-sensitive emulsion layer; and a cyan dye forming coupler, to a red-sensitive emulsion layer; respectively. However, it is also allowed to prepare a silver halide color photographic light sensitive material in any other ways than the above-mentioned combination so as to meet the purposes.

It is preferable that these dye forming couplers are to contain a so-called ballast group, that is, a non-coupler-diffusing group having not less than 8 carbon atoms in the molecules of the coupler. These dye-forming couplers may be either one of those of the 4-equivalent type in which the silver ions of the four molecules are required to be reduced for forming one molecule of a dye, and those of the 2-equivalent type, in which the silver ions of the two molecules are required for forming one molecule of a dye. It is also allowed to use a DIR coupler capable of releasing a development inhibitor while carrying out a development so that the sharpness and graininess of the resulting images can be improved, or a DIR compound capable of producing a colorless compound upon making a coupling reaction with the oxidized products of a developing agent and, at the same time, releasing a development inhibitor.

The DIR couplers and DIR compounds each applicable thereto include those each directly bonding an inhibitor to the coupling position thereof, and those each bonding an inhibitor to the coupling position thereof through a divalent group and the inhibitor can be released with any one of an intramolecular nucleophilic reaction, an intramolecular electron-transfer reaction and so forth produced in the group split off in the coupling reaction, (these couplers and compounds are referred to as timing DIR couplers and timing DIR compounds, respectively.)

A colorless coupler capable of making a coupling reaction with the oxidized products of an aromatic primary amine developing agent, but incapable of producing any dye (that is also so-called a competing coupler) may also be used with a dye forming coupler in combination.

The yellow dye forming couplers applicable thereto include, for example, well-known acyl acetanilide type couplers. Among them, the benzoyl acetoanilide type and pivaloyl acetanilide type compounds can advantageously be used.

In the invention, $\lambda$ L0.2 of a yellow image is preferably 515 nm.

In the invention, '$\lambda$ L.0.2' is defined as follows. In the following defined spectral absorbance $A(\lambda)$ of a yellow image, an average absorbance value Am from 560 to 650 nm is standardized, $$\left( Am = \frac{\int_{560}^{650} Ad\lambda}{650 - 560} \right)$$

and, in the yellow image, when the absorbance Amax thereof is 1.0±0.05 higher than Am in wavelength $\lambda$max corresponding to the maximum absorbance Amax of the above-mentioned spectral absorbance, a wavelength on the longer wavelength side than the above-mentioned $\lambda$max and corresponding to absorbance $A=0.8 \times Am+0.2 \times Amax$ is defined as $\lambda$ L0.2. Also, $\lambda$ L0.2 means a wavelength showing $A = 0.2 \times Am+0.8+Amax$ in the above-mentioned spectral absorbance.

Amax is a light absorbance in kmax of a yellow image and is usually obtained from the range of not less than 400 nm.

When the maximum value of a color image is not obtained by other factors such as the presence of a UV absorbent or the like, such an Amax is represented by a light absorbance obtained from a wavelength between 400 to 500 nm in which the absolute value of $dA/d\lambda$ is minimized, that is, a light absorbance obtained in the shoulder portion.

The above-mentioned yellow image is formed by controlling the separation exposure conditions to be maximized so that Amax—Am can be minimized when the Amax—Am is 1.0±0.05, and then by the development is carried out.

In the invention, the spectral absorption of the above-mentioned yellow image is to be preferably $\lambda$ L.0.8>450 nm and particularly $\lambda$ L0.8>455 nm. And, $\lambda$ L0.2 is to be preferably not more than 510 nm. $\lambda$max is to be preferably not less than 430 nm.

In this invention, the spectral absorption measurements are carried out through a spectrophotometer Model 320 manufactured by Hitachi, Ltd., to which an integrating sphere is attached.

When a light sensitive material of the invention contains a coupler as the substance for forming a yellow image, any types of couplers can be used therein, provided they can satisfy the above-mentioned requirements. However, the preferable couplers include, for example, the couplers represented by the following Formula [Y-I].

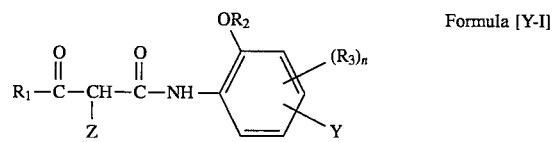

Formula [Y-I]

In the above-given formula, $R_1$ represents an alkyl or cycloalkyl group; $R_2$ represents an alkyl, cycloalkyl, acyl or aryl group; $R_3$ represents a group capable of being substituted to a benzene ring; n is an integer of 0 or 1; Y represents a monovalent ballast group; and Z represents a hydrogen atom or a group capable of splitting off when making a coupling reaction.

The concrete examples of the couplers preferably applicable thereto include, typically, the compounds Y-I-1 through Y-I-55 each given in JP OPI Publication No. 3-241345/1991 and, besides the above, the compounds Y-1 through Y-30 each given in JP OPI Publication No. 3-209466/1991 may also preferably be used.

In silver halide emulsion layers, the above-mentioned yellow coupler is usually contained in an amount within the range of $1 \times 10^{-3}$ to 1 mol and preferably $1 \times 10^{-2}$ to $8 \times 10^{-1}$ mols per silver halide used.

In the magenta image forming layers relating to the invention, the compound represented by the following Formula [M-I] is preferably contained.

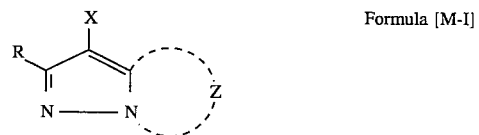

Formula [M-I]

In the above-given formula, Z represents a group consisting of non-metal atoms necessary to form a nitrogen-containing heterocyclic ring, provided that the ring formed of the above-mentioned Z may also have a substituent.

X represents a hydrogen atom or a group capable of splitting off upon making a reaction with the oxidized products of a color developing agent; and R represents a hydrogen atom or a substituent.

In the above-given Formula [M-I], there is no special limitation to the substituents represented by R. However, they include, typically, each of the groups of alkyl, aryl, anilino, acylamino, sulfonamido, alkylthio, arylthio, alkenyl or cycloalkyl and, besides, they also include, a halogen atom, each of the groups of cycloalkenyl, alkinyl, heterocyclic, sulfonyl, sulfinyl, phosphonyl, acyl, carbamoyl, sulfamoyl, cyano, alkoxy, aryloxy, heterocyclic-oxy, siloxy, acyloxy, carbamoyloxy, amino, alkylamino, imido, ureido, sulfamoylamino, alkoxycarbonylamino, alkoxycarbonyl, aryloxycarbonyl or heterocyclic-thio, and a spiro-compound residual group and a cross-linked hydrocarbon compound residual group.

The substituents represented by R, the groups capable of splitting off upon making a reaction with the oxidized products of a color developing agent, the nitrogen-containing heterocyclic rings formed by Z and the rings formed by Z, each may have the above-mentioned substituents, as described above. The preferable scope of the substituents and the typical examples thereof, and the preferable scope of the magenta couplers represented by Formula [M-I] are each the same as those given in European Patent Publication No. 0327272, p.5, the 23rd line to p.8, the 52th line.

The typical examples of the magenta couplers represented by Formula [M-I] will be given below.

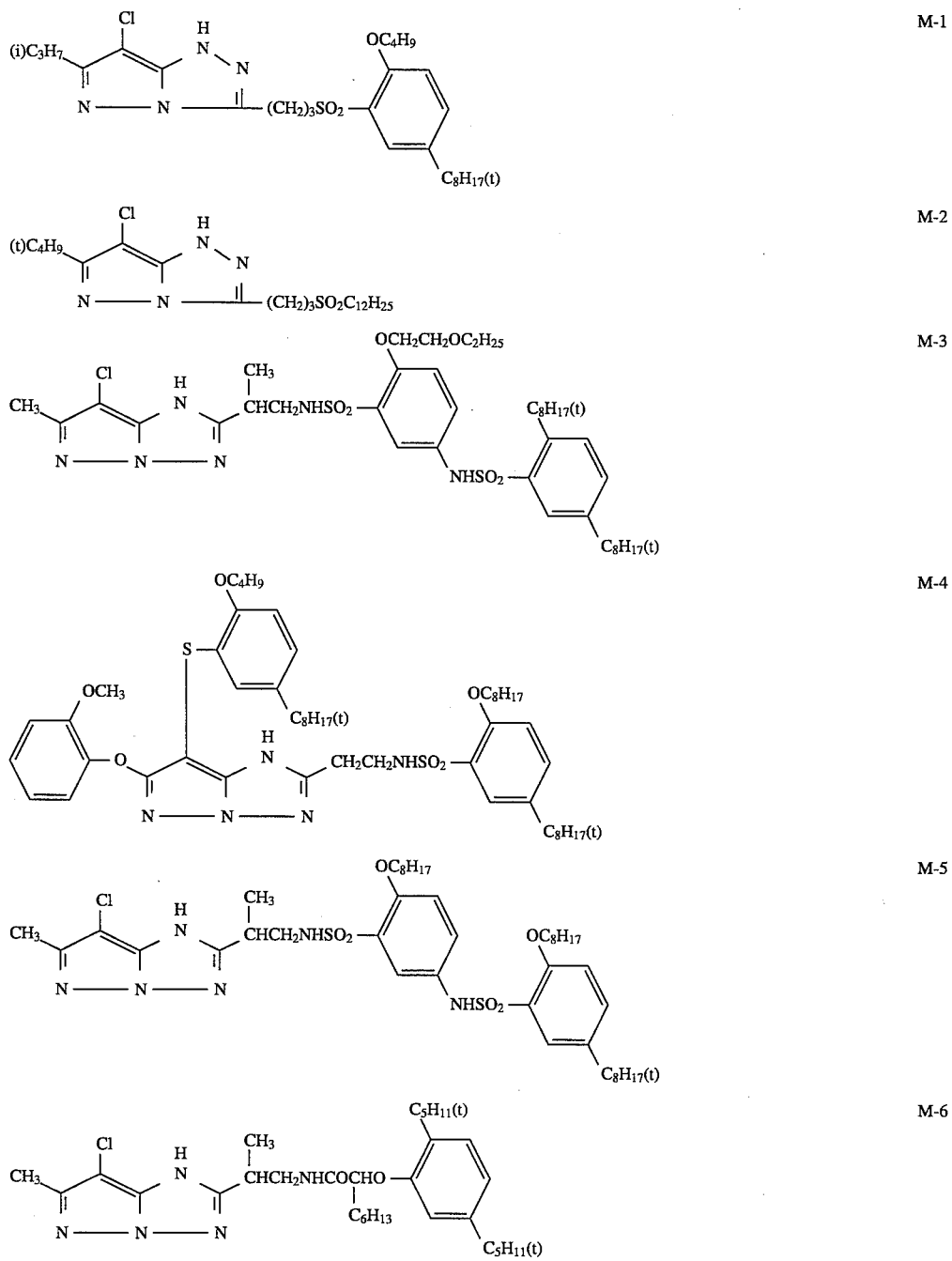

-continued
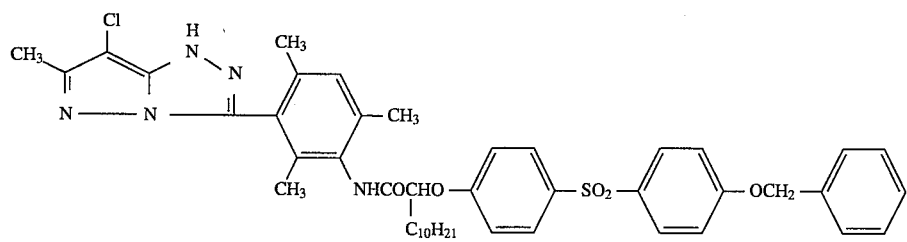
M-7
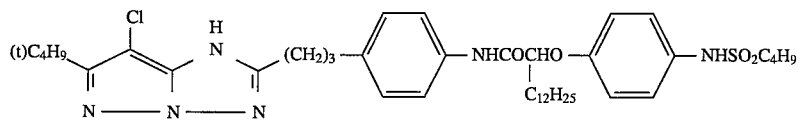
M-8
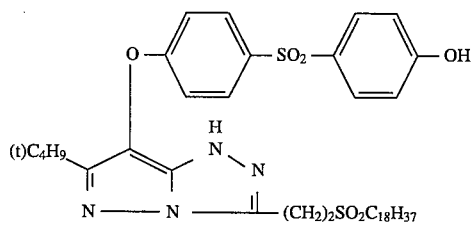
M-9
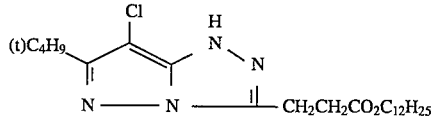
M-10
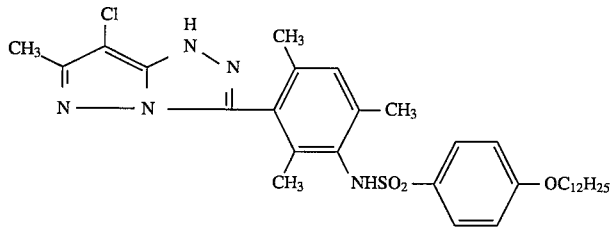
M-11
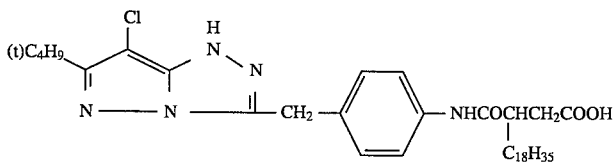
M-12
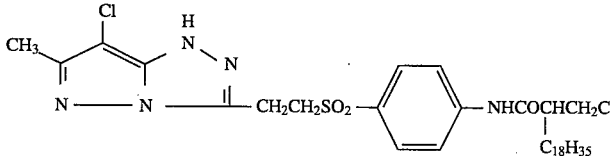
M-13
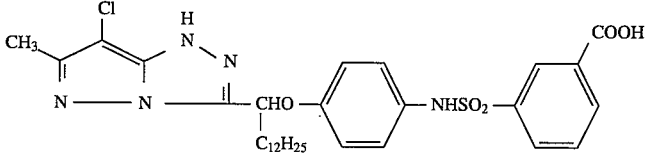
M-14
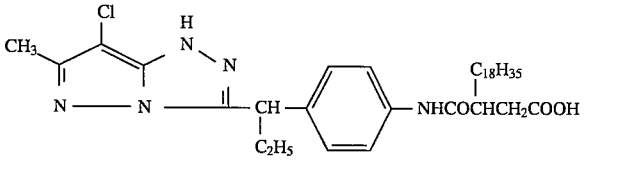
M-15

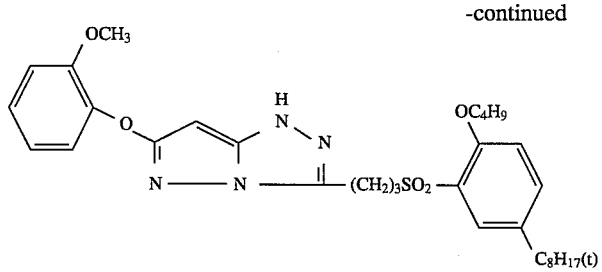

M-16

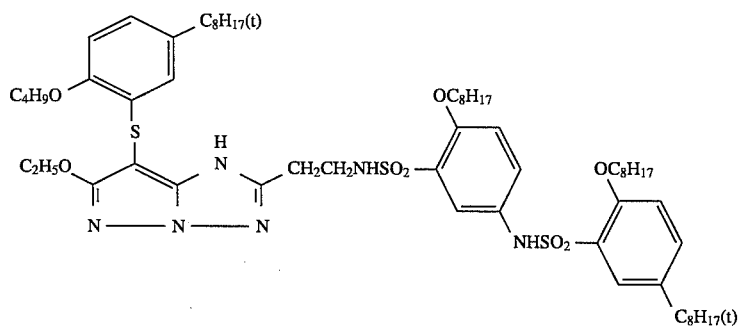

M-17

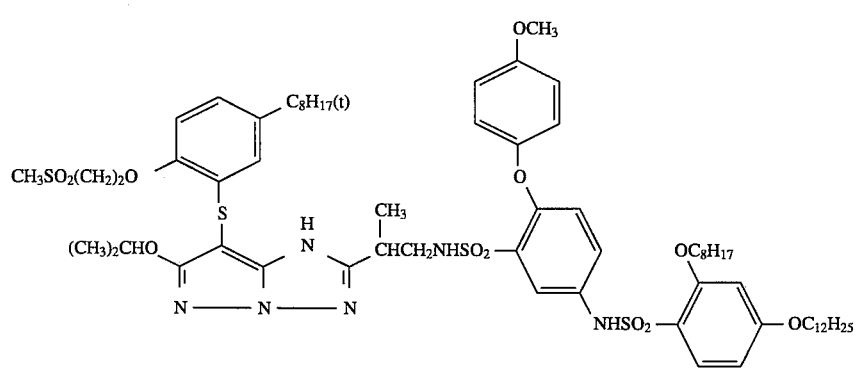

M-18

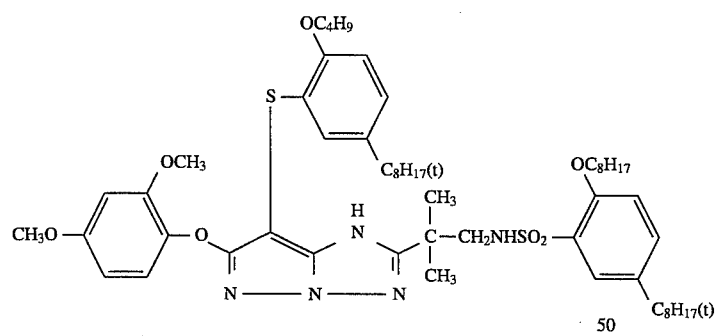

M-19

Further, the other typical examples thereof include those other than the above-given typical examples given in the compounds M-1 through M-16 given in European Patent Publication No. 0273712, pp. 6–21 and the compounds 1 through 223 given in European Patent Publication No. 0235913, pp. 36–92.

The aforementioned couplers can be synthesized with reference to Journal of the Chemical Society, Perkin I, 1977, 2047–2052; U.S. Pat. No. 3,725,067; and JP OPI Publication Nos. 59-99437/1984, 58-42045/1983, 59-162548/1984, 59-171956/1984, 60-33552/1985, 60-43659/1985, 60-172982/1985, 60-190779/1985, 62-209457/1987 and 63-307453/1988.

The above-described couplers may also be used with other kinds of magenta couplers in combination and may be commonly used in an amount within the range of $1\times10^{-3}$ mols to 1 mol and, preferably, $1\times10^{-2}$ mols to $8\times10^{-1}$ mols, each per mol of silver halide used.

In the color photographic light sensitive materials of the invention, $\lambda$ L0.2 of the spectral absorption of a magenta image is preferably within the range of 580 to 635 nm.

In the silver halide color photographic light sensitive materials of the invention, when the $\lambda$ L0.2 thereof is within the range of 580 to 635 nm, the $\lambda$max of the spectral absorption of a magenta image is preferably within the range of 530 to 560 nm.

In the silver halide color photographic light sensitive materials of the invention, the $\lambda$ L0.2 and $\lambda$max of the spectral absorption of a magenta image are the values measured in the following procedures.

Procedures for Measuring $\lambda$L0.2 and $\lambda$max

In the case of a positive type silver halide color photographic light sensitive material, it is exposed uniformly to red light having a minimum quantity to obtain the minimum density of a cyan image and is then exposed uniformly to blue light having a minimum quantity to obtain the minimum density of a yellow image. Successively, it is exposed to white light through an ND filter and then developed. At that time, the ND filter density is so adjusted as to have the maximum value of a light absorbance of 1.0, when the spectral absorption between 500 and 700 nm is measured upon attaching an integrating sphere to a spectrophotometer, and a zero correction is made by a standard white plate made of magnesium oxide, so that a magenta image can be formed.

In the case of a negative type silver halide color photographic light sensitive material, an ND filter density is so adjusted as to have the maximum light absorbance in the same manner as in the case of the positive type light sensitive materials, when a magenta image is formed by exposing the light sensitive material to green light through the ND filter and is then developed. The term, $\lambda$ L0.2, herein means a wavelength longer than the wavelengths showing the maximum light absorbance of 1.0 in the spectral absorbance curve of the magenta image, that is, the wavelength showing a light absorbance of 0.2.

The cyan dye forming couplers applicable thereto include, for example, those of the well-known phenol, naphthol or imidazole type, and they include, typically, the phenol type couplers substituted with an alkyl, acylamino or ureido group, the naphthol type couplers produced of a 5-aminonaphthol skelton, the 2-equivalent naphthol type couplers introduced thereinto with an oxygen atom as the elimination group, and so forth.

The supports applicable to the light sensitive materials of the invention include, for example, those given in the foregoing RD17643, p.28 and RD18716, p.647. The suitable supports are made of a polymer film, a sheet of paper, or the like. They may also be treated to enhance the adhesive property, antistatic property and so forth.

EXAMPLES

The invention will be detailed with reference to the following examples. However, the invention shall not be limited thereto.

Example 1

Preparation of Emulsion EM-1

A cubic silver chlorobromide core emulsion having a grain size of 30 μm was prepared, in a controlled double-jet precipitation method, by adding at the same time an aqueous solution containing ammonia and silver nitrate and an aqueous solution containing potassium bromide and sodium chloride (in a mol ratio of KBr:NaCl=95:5), while controlling an aqueous ossein gelatin containing solution to be kept at 40° C. At that time, the pH and pAg thereof were so controlled as to form the cubes as the grain configuration thereof. To the resulting core emulsion, another aqueous solution containing ammonia and silver nitrate, and another aqueous solution containing potassium bromide and sodium chloride (in a mol ratio of KBr:NaCl=40:60) were further added at the same time, in a controlled double-jet precipitation method, so that the shells were grown up to have an average grain size of 0.42 μm. At that time, the pH and pAg thereof were so controlled as to form the cubes as the grain configuration thereof.

After completing a washing treatment to remove the resulting water-soluble salts, gelatin was then added, so that Emulsion EM-1 could be prepared. The resulting emulsion EM-1 was proved to have a distribution range of 8%.

Preparation of Emulsion EM-2

A cubic silver chlorobromide core emulsion having a grain size of 0.18 μm was prepared, in a controlled double-jet precipitation method, by adding at the same time an aqueous solution containing ammonia and silver nitrate, and an aqueous solution containing potassium bromide and sodium chloride (in a tool ratio of KBr:NaCl=95:5), while controlling an aqueous ossein gelatin containing solution to be kept at 40° C. At that time, the pH and pAg thereof were so controlled as to form the cubes as the grain configuration thereof. To the resulting core emulsion, another aqueous solution containing ammonia and silver nitrate, and another aqueous solution containing potassium bromide and sodium chloride (in a mol ratio of KBr:NaCl=40:60) were further added at the same time, in a controlled double-jet precipitation method, so that the shells were grown up to have an average grain size of 0.25 μm. At that time, the pH and pAg thereof were so controlled as to form the cubes as the grain configuration thereof.

After completing a washing treatment to remove the resulting water-soluble salts, gelatin was then added, so that Emulsion EM-2 could be prepared. The resulting emulsion EM-2 was proved to have a distribution range of 8%.

Preparation of Blue-sensitive Emulsion EM-B

Sensitizing dye D-1 was added to EM-1 to make a color sensitization, and T-1 was then added in an amount of 600 mg per mol of silver, so that blue-sensitive emulsion EM-B could be prepared.

Preparation of Green-sensitive Emulsion EM-G

A green-sensitive emulsion EM-G was prepared in the same procedures as in the blue-sensitive emulsion, except that sensitizing dye D-2 was added to EM-1.

Preparation of R-sensitive Emulsion EM-R

A red-sensitive emulsion EM-R was prepared in the same procedures as in the blue-sensitive emulsion, except that sensitizing dyes D-3 and D-4 were each added to EM-2.

Preparation of Panchromatically sensitive Emulsion EM-P

A panchromatically sensitive emulsion EM-P was prepared in the same procedures as in the blue-sensitive emulsion, except that sensitizing dyes D-1, D-2, D-3 and D-4 were each added to EM-1.

Preparation of Infrared sensitive Emulsion EM-I

An infrared sensitive emulsion EM-I was prepared in the same procedures as in the blue-sensitive emulsion, except that sensitizing dyes D-5 was added to EM-1.

T-1 : 4-hydroxy-6-methyl-1,3,3a,7-tetrazaindene

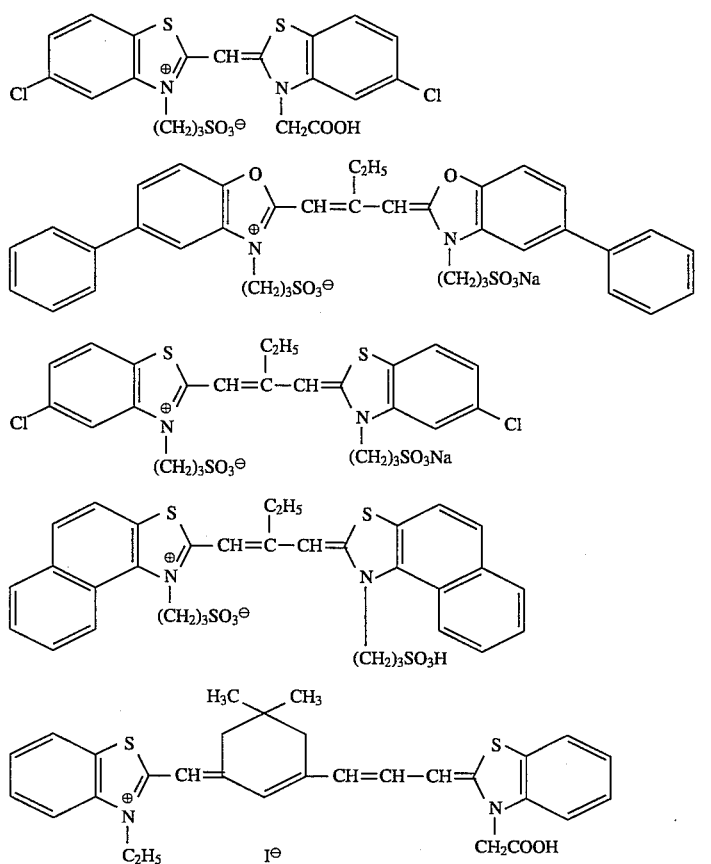

Preparation of Light Sensitive Material A

A color photographic light sensitive material having the following constitution was prepared by making use of the resulting emulsions EM-B, EM-G, EM-R and EM-P.

The support was made of a 110 μm-thick RC paper applied with an anatase type titanium oxide. Layers 1 through 10 were each coated on the front side of the support, and Layer 11 on the back side thereof to have the following compositions, respectively. The sample was prepared by making additional use of SA-1 and SA-2 as the coating aids, and H-1 and H-2 as the layer hardeners, respectively.

In preparing the coating solutions, the panchromatic emulsion EM-P contained in Layers 3, 5 and 9 were mixed into the coating solution separately prepared by eliminating the panchromatic emulsions. Immediately after mixing them, the resulting coating solution was coated. The gelatin applied thereto was that having a transmittance improved by adding aqueous hydrogen peroxide thereto in the late stage of an ossein-liming treatment so as to make the coloration of the ossein lower, and then to extract the gelatin.

SA-1 : Sodium sulfosuccinic di(2-ethylhexyl) ester
SA-2 : Sodium sulfosuccinic di(2,2,3,3,4,4,5,5-octafluoropentyl) ester
H-1 : Sodium 2,4-dichloro-6-hydroxy-s-triazine
H-2 : Tetrakis(vinyl sulfonylmethyl) methane

| Layer | Composition | Coating weight (g/m$^2$) |
|---|---|---|
| Layer 10 | (a UV absorbing layer) | |
| | Gelatin | 0.78 |
| | UV absorbent (UV-1) | 0.065 |
| | UV absorbent (UV-2) | 0.120 |
| | UV absorbent (UV-3) | 0.160 |
| | Oil-soluble dye 1 | 0.5 × 10$^{-3}$ |
| | Oil-soluble dye 2 | 0.5 × 10$^{-3}$ |
| | Solvent (SO-2) | 0.1 |
| | Silica matting agent | 0.03 |
| Layer 9 | (a blue-sensitive layer) | |
| | Gelatin | 1.43 |
| | Blue-sensitive emulsion EM-B | 0.4 (in Ag coating weight) |

-continued

SA-1 : Sodium sulfosuccinic di(2-ethylhexyl) ester
SA-2 : Sodium sulfosuccinic di(2,2,3,3,4,4,5,5-octafluoropentyl) ester
H-1 : Sodium 2,4-dichloro-6-hydroxy-s-triazine
H-2 : Tetrakis(vinyl sulfonylmethyl) methane

| Layer | Composition | Coating weight (g/m²) |
|---|---|---|
| | Panchromatic emulsion EM-P | (in Ag coating weight) |
| | Yellow coupler (YC-1) | 0.82 |
| | Antistaining agent (AS-2) | 0.025 |
| | Solvent (SO-1) | 0.82 |
| | Inhibitors (ST-1, ST-2, T-1) | 0.005 |
| Layer 8 | (an intermediate layer) | |
| | Gelatin | 0.54 |
| | Color mixture preventive, (AS-1, AS-3, AS-4) | 0.055 |
| | Solvent (SO-2) | 0.072 |
| | Anti-irradiation dye (AI-3) | 0.03 |
| Layer 7 | (a yellow colloidal layer) | |
| | Gelatin | 0.42 |
| | Yellow colloidal silver | 0.03 |
| | Color mixture preventive, (AS-1, AS-3, AS-4 in equivalency) | 0.04 |
| | Solvent (SO-2) | 0.049 |
| | Polyvinyl pyrrolidone (PVP) | 0.047 |
| Layer 6 | (an intermediate layer) | |
| | Gelatin | 0.54 |
| | Color mixture preventive, (AS-1, AS-3, AS-4 in equivalency) | 0.055 |
| | Solvent (SO-2) | 0.072 |
| Layer 5 | (a green-sensitive layer) | |
| | Gelatin | 1.43 |
| | Green-sensitive emulsion EM-G | 0.40 (in silver coating weight) |
| | Panchromatic emulsion EM-P | 0.10 (in silver coating weight) |
| | Magenta coupler (MC-1) | 0.25 |
| | Yellow coupler (YC-2) | 0.06 |
| | Antistaining agent (AS-2) | 0.019 |
| | Solvent (SO-1) | 0.31 |
| | Inhibitors (ST-1, ST-2, T-1) | 0.005 |
| Layer 4 | (an intermediate layer) | |
| | Gelatin | 0.75 |
| | Color mixture preventive, (AS-1, AS-3, AS-4 in equivalency) | 0.055 |
| | Solvent (SO-2) | 0.072 |
| | Anti-irradiation dye (AI-1) | 0.03 |
| | Anti-irradiation dye (AI-2) | 0.03 |
| Layer 3 | (a red-sensitive layer) | |
| | Gelatin | 1.38 |
| | Red-sensitive emulsion EM-R | 0.24 (in silver coating weight) |
| | Panchromatic emulsion EM-P | 0.06 (in silver coating weight) |
| | Cyan coupler (CC-2) | 0.44 |
| | Solvent (SO-1) | 0.31 |
| | Antistaining agent (AS-2) | 0.015 |
| | Inhibitors (ST-1, ST-2, T-1) | 0.003 |
| Layer 2 | (an intermediate layer) | |
| | Gelatin | 0.54 |
| | Color mixture preventive, (AS-1, AS-3, AS-4 in equivalency) | 0.055 |
| | Solvent (SO-2) | 0.072 |
| Layer 1 | (an HC layer) | |
| | Gelatin | 0.54 |
| | Black colloidal silver | 0.08 |
| | Polyvinyl pyrrolidone (PVP) | 0.03 |
| Layer 11 | (a back-side layer) | |
| | Gelatin | 6.00 |
| | Silica matting agent | 0.65 |

The above-given silver coating weights are indicated by converting them into the silver contents.

Light Sensitive Material B is prepared in the same manner as in Light Sensitive Material A except that the ratios of the red-sensitive emulsion to the panchromatic emulsion, the green-sensitive emulsion to the panchromatic emulsion and the blue-sensitive emulsion to the panchromatic emulsion were each changed into 70/30, respectively.

Light Sensitive Material C is prepared in the same manner as in Light Sensitive Material A except that panchromatic emulsion EM-P of the blue-sensitive layer, the green-sensitive layer and the red-sensitive layer is replaced with the EM-B, the EM-G and the EM-R respectively.

Further, Light Sensitive Material D was prepared as follows.

| Layer | Composition | Coating weight (g/m²) |
|---|---|---|
| Layer 12 | (a UV absorbing layer) | |
| | Gelatin | 0.78 |
| | UV absorbent (UV-1) | 0.065 |
| | UV absorbent (UV-2) | 0.120 |
| | UV absorbent (UV-3) | 0.160 |
| | Solvent (SO-2) | 0.1 |
| | Silica matting agent | 0.03 |
| Layer 11 | (a blue-sensitive layer) | |
| | Gelatin | 1.14 |
| | Blue-sensitive emulsion EM-B (in Ag coating weight) | 0.4 |
| | Yellow coupler (YC-1) | 0.656 |
| | Antistaining agent (AS-2) | 0.02 |
| | Solvent (SO-1) | 0.656 |
| | Inhibitors (ST-1, ST-2, T-1) | 0.005 |
| Layer 10 | (an intermediate layer) | |
| | Gelatin | 0.54 |
| | Color mixture preventive, (AS-1, AS-3, AS-4 in equivalency) | 0.055 |
| | Solvent (SO-2) | 0.072 |
| | Anti-irradiation dye (AI-3) | 0.03 |
| Layer 9 | (a yellow colloidal layer) | |
| | Gelatin | 0.42 |
| | Yellow colloidal silver | 0.1 |
| | Color mixture preventive, (AS-1, AS-3, AS-4 in equivalency) | 0.05 |
| | Solvent (SO-2) | 0.049 |
| | Polyvinyl pyrrolidone (PVP) | 0.047 |
| Layer 8 | (an intermediate layer) | |
| | Gelatin | 0.54 |
| | Color mixture preventive, (AS-1, AS-3, AS-4 in equivalency) | 0.055 |
| | Solvent (SO-2) | 0.072 |
| Layer 7 | (a green-sensitive layer) | |
| | Gelatin | 1.14 |
| | Green-sensitive emulsion EM-G (in silver coating weight) | 0.40 |
| | Magenta coupler (MC-1) | 0.20 |
| | Yellow coupler (YC-2) | 0.05 |
| | Antistaining agent (AS-2) | 0.0152 |
| | Solvent (SO-1) | 0.248 |
| | Inhibitors (ST-1, ST-2, T-1) | 0.005 |
| Layer 6 | (an intermediate layer) | |
| | Gelatin | 0.75 |
| | Color mixture preventive, (AS-1, AS-3, AS-4 in equivalency) | 0.055 |
| | Solvent (SO-2) | 0.072 |
| | Anti-irradiation dye (AI-1) | 0.03 |
| | Anti-irradiation dye (AI-2) | 0.03 |
| Layer 5 | (a red-sensitive layer) | |
| | Gelatin | 1.10 |
| | Red-sensitive emulsion EM-R (in silver coating weight) | 0.24 |
| | Cyan coupler (CC-2) | 0.352 |
| | Solvent (SO-1) | 0.248 |
| | Antistaining agent (AS-2) | 0.012 |
| | Inhibitors (ST-1, ST-2, T-1) | 0.003 |
| Layer 4 | (an intermediate layer) | |
| | Gelatin | 0.75 |
| | Color mixture preventive, (AS-1, AS-3, AS-4 in equivalency) | 0.055 |
| | Solvent (SO-2) | 0.072 |
| Layer 3 | (an infrared-sensitive layer) | |
| | Gelatin | 1.05 |

| Layer | Composition | Coating weight (g/m²) |
|---|---|---|
| | Infrared-sensitive emulsion EM-I (in Ag coating weight) | 0.30 |
| | Yellow coupler (YC-1) | 0.21 |
| | Magenta coupler (MC-1) | 0.063 |
| | Cyan coupler (CC-1) | 0.110 |
| | Antistaining agent (AS-2) | 0.019 |
| | Solvent (SO-1) | 0.615 |
| Layer 2 | (an intermediate layer) | |
| | Gelatin | 0.54 |
| | Color mixture preventive, (AS-1, AS-3, AS-4 in equivalency) | 0.055 |
| | Solvent (SO-2) | 0.072 |
| Layer 1 | (an HC layer) | |
| | Gelatin | 0.54 |
| | Black colloidal silver | 0.08 |
| | Polyvinyl pyrrolidone (PVP) | 0.03 |
| Layer 11 | (a back-side layer) | |
| | Gelatin | 6.00 |
| | Silica matting agent | 0.65 |

SO-1: trioctyl phosphate
SO-2: Dioctyl phthalate
AS-1: 2,4-di-t-octyl hydroquinone
AS-2: 2,4-di-t-butyl hydroquinone
ST-1: 1-(3-acetoamidophenyl)-5-mercaptotetrazole
ST-2: N-benzyl adenine Oil-soluble dye 1

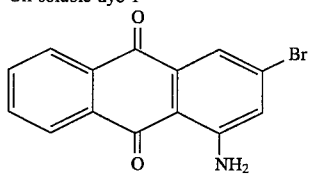

Oil-soluble dye 2

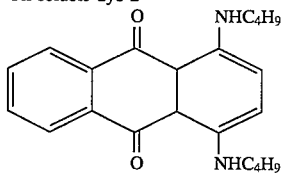

As-3

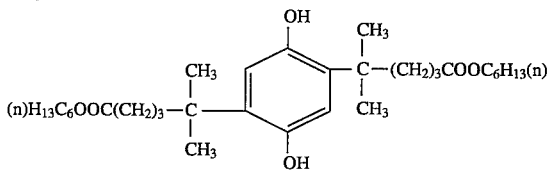

As-4    A mixture of

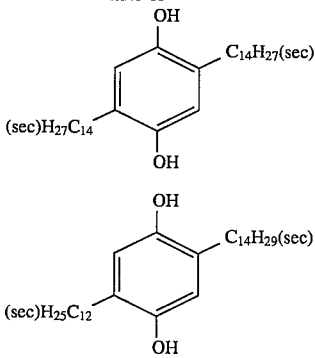

-continued
| Layer | Composition | Coating weight (g/m²) |
|---|---|---|
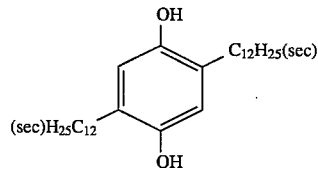
UV-1
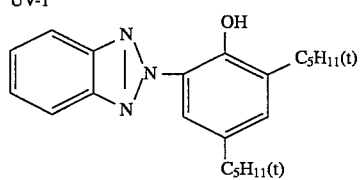
UV-2
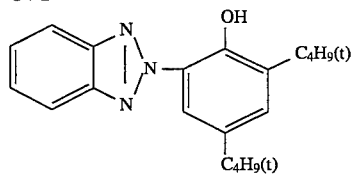
UV-3
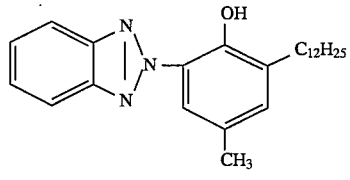
YC-1
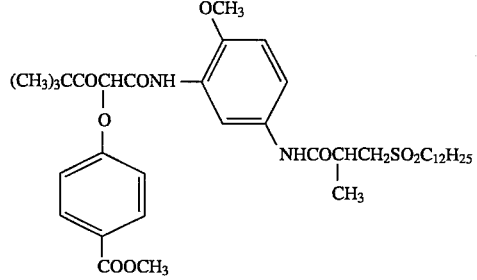
YC-2
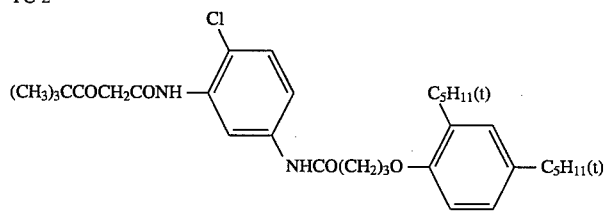
MC-1
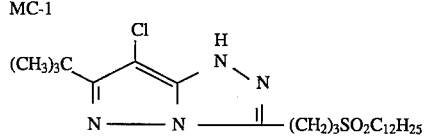
CC-1

| Layer | Composition | Coating weight (g/m²) |
|---|---|---|

CC-2

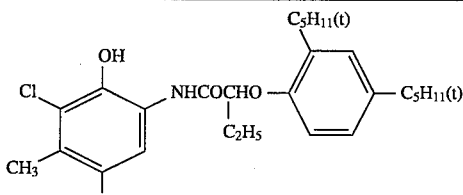

AI-1

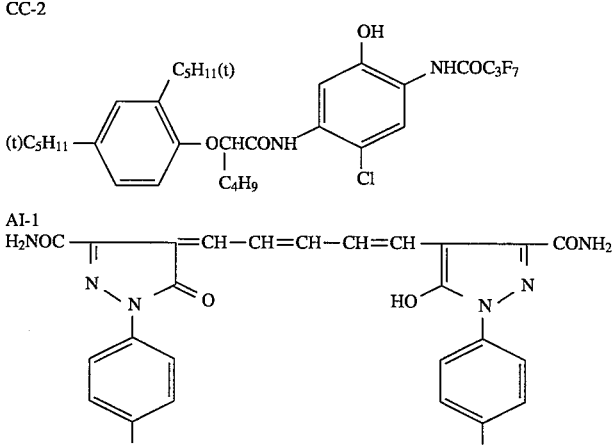

AI-2

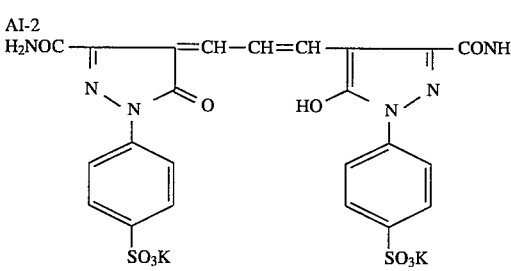

AI-3

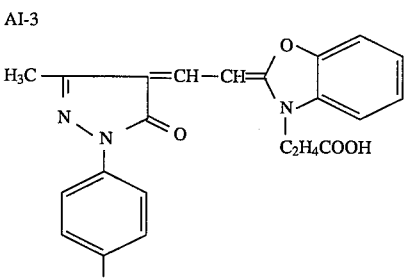

The above-mentioned Light Sensitive Materials A and B were each brought into close contact with the black and cyan printers each of a halftone dot original document, and they were exposed to light under the following exposure conditions 1. Next, the Materials were each brought into close contact with the black and magenta printers, and they were exposed to light under the following exposure conditions 2. Further, the Materials were each brought into close contact with the black and yellow printers, and they were exposed to light under the following exposure conditions 3.

In the same manner as in Light Sensitive Materials A and B, Light Sensitive Materials C and D were each exposed to light under the exposure conditions 1 through 3 in order, and they were brought into close contact with only the black printer of an original document. Then, they were exposed to light under the following exposure conditions 4.

The resulting exposed light sensitive materials were each processed in the following developing steps, so that the dye images formed of halftone dots could be obtained.

The results of measuring the image densities will be given below. For measuring the densities, a densitometer, Model PDA-65 manufactured by Konica Corp., was used.

Exposure Conditions 1

Each of the light sensitive materials was exposed to white light through a red filter (Wratten No. 26) and an ND filter. At that time, the ND filter density was adjusted to provide the minimum exposure quantity obtained when the red light density was minimized after processing the light sensitive materials, and the exposures were each made for 0.5 seconds in the above-mentioned minimum exposure quantity.

Exposure Conditions 2

Each of the light sensitive materials was exposed to white light through a green filter (Wratten No. 58) and an ND filter. At that time, the ND filter density was adjusted to provide the minimum exposure quantity obtained when the green light density was minimized after processing the light sensitive materials, and the exposures were each made for 0.5 seconds in the above-mentioned minimum exposure quantity.

Exposure Conditions 3

Each of the light sensitive materials was exposed to white light through a blue filter (Wratten No. 47B) and an ND filter. At that time, the ND filter density was adjusted to provide the minimum exposure quantity obtained when the blue light density was minimized after processing the light sensitive materials, and the exposures were each made for 0.5 seconds in the above-mentioned minimum exposure quantity.

Exposure Conditions 4

Each sample of the light sensitive materials was exposed to light under the above-mentioned exposure conditions 1 through 3 in order, and the resulting exposed samples were then exposed to tungsten light through an infrared filter and an ND filter. At that time, the ND filter density was adjusted to provide the minimum exposure quantity obtained when the visible light density was minimized after processing the samples, and the exposures were each made for 0.5 seconds in the above-mentioned minimum exposure quantity. Only the exposure to be made to tungsten light through the infrared filter was regarded as Exposure conditions 4.

As for the light source for Exposure conditions 1 through 3, a daylight fluorescent lamp was used.

The treatments were carried out in accordance with the following processing steps (that is, the so-called fresh solution treatment), provided that the fogging exposure was made uniformly on the overall surfaces of the light sensitive materials through the 3 mm-thick developer layer while keeping them in a developer.

Another part of each samples were exposed in quite the same manner and were then treated also in the same manner as in processing steps 1, except that the processing solutions were replaced by the developer, bleach-fixer and stabilizer each used in the running treatments for the above-mentioned Light Sensitive Material B, in which the developer was used after the replenisher was added thereto up to the total amount three times as much as the capacity of the processing tank, (that is, a so-called running treatment). Concerning the images formed in the fresh solution treatments, the density in the halftone dot image area having such a halftone dot ratio as the density measured through green light could be 0.3 and, concerning the images formed in the running treatments, the same density as mentioned above; how was the latter density varied by the former density will be shown below in terms of the differences of the green densities, $\Delta$ DG. Further, Concerning the resulting images having the solid black portions of the black printer (having a halftone dot ratio of 100%), the blue-, green- and red-light densities thereof were measured, and the variations of the ratios of $(DB/DG) \times 100$ and $(DR/DG) \times 100$ each between the fresh solution treatments and the running treatments will be shown below in terms of $\Delta\{(DB/DG) \times 100\}$ and $\Delta\{(DR/DG) \times 100\}$.

| Processing step 1 | Temperature | Time |
|---|---|---|
| Dipping (in a developer) | 37° C. | 12 sec. |
| Fogging exposure | — | 12 sec.(at 1 lux) |
| Developing | 37° C. | 95 sec. |
| Bleach-fixing | 35° C. | 45 sec. |
| Stabilizing | 25–30° C. | 90 sec. |
| Drying | 60–85° C. | 40 sec. |

Compositions of Processing Solutions
(Color developer)

| | |
|---|---|
| Benzyl alcohol | 15.0 ml |
| Ceric sulfate | 0.015 g |
| Ethylene glycol | 8.0 ml |
| Potassium sulfite | 2.5 g |
| Potassium bromide | 0.6 g |
| Sodium chloride | 0.2 g |
| Potassium carbonate | 25.0 g |
| T-1 | 0.1 g |
| Hydroxylamine sulfate | 5.0 g |
| Sodium diethylenetriamine pentaacetate | 2.0 g |
| 4-amino-N-ethyl-N-(β-hydroxyethyl) aniline sulfate | 4.5 g |
| Fluorescent whitening agent, (a 4,4'-diaminostilbene disulfonic acid derivative) | 1.0 g |
| Potassium hydroxide | 2.0 g |
| Diethylene glycol | 15.0 ml |
| Add water to make in total of | 1 liter |
| Adjust pH to be | pH 10.15 |

(Bleach-fixer)

| | |
|---|---|
| Ferric ammonium diethylenetriamine pentaacetate | 90.0 g |
| Diethylenetriamine pentaacetic acid | 3.0 g |
| Ammonium thiosulfate, (in an aqueous 70% solution) | 180 ml |
| Ammonium sulfite, (in an aqueous 40% solution) | 27.5 ml |
| 3-mercapto-1,2,4-triazole | 0.15 g |
| Adjust pH with potassium carbonate or glacial acetic acid to be | pH 7.1 |
| Add water to make in total of | 1 liter |

(Stabilizer)

| | |
|---|---|
| o-phenylphenol | 0.3 g |
| Potassium sulfite (in an aqueous 50% solution) | 12 ml |
| Ethylene glycol | 10 g |
| 1-hydroxyethylidene-1,1-diphosphonic acid | 2.5 g |
| Bismuth chloride | 0.2 g |
| Zinc sulfate septihydrate | 0.7 g |
| Ammonium hydroxide, (in an aqueous 28% solution) | 2.0 g |
| Polyvinyl pyrrolidone (K-17) | 0.2 g |
| Fluorescent whitening agent, (a 4,4'-diaminostilbene disulfonic acid derivative) | 2.0 g |
| Add water to make in total of | 1 liter |
| Adjust pH with ammonium hydroxide or sulfuric acid to be | pH 7.5 |

In the stabilizing step, a double-tank type counter-current system is adopted.

The formulas of the replenishers used for the running treatments will be given below.

(Color developer replenisher)

| | |
|---|---|
| Benzyl alcohol | 18.5 ml |
| Ceric sulfate | 0.015 g |
| Ethylene glycol | 10.0 ml |
| Potassium sulfite | 2.5 g |
| Potassium bromide | 0.3 g |
| Sodium chloride | 0.2 g |
| Potassium carbonate | 25.0 g |
| T-1 | 0.1 g |
| Hydroxylamine sulfate | 5.0 g |
| Sodium diethylenetriamine pentaacetate | 2.0 g |
| 4-amino-N-ethyl-N-(β-hydroxyethyl) aniline sulfate | 5.4 g |
| Fluorescent whitening agent | 1.0 g |

-continued

| | |
|---|---|
| (a 4,4'-diaminostilbene disulfonic acid derivative) | |
| Potassium hydroxide | 2.0 g |
| Diethylene glycol | 18.0 ml |
| Add water to make in total of | 1 liter |
| Adjust pH to be | pH 10.35 |

(Bleach-fixer replenisher)

The same as the above-given bleach-fixer.

(Stabilizer replenisher)

The same as the above-given stabilizer.

The replenishing amounts of the developer replenisher, bleach-fixer and stabilizer were each 320 ml per sq.meter of a subject light sensitive material used.

The results will be shown below.

TABLE 1

| Light Sensitive Material No. | Number of Processing steps | Monochromatic density | | | Black density | | | Chromatic approximation (in magenta) *1 | Halftone dot quality (in magenta) |
|---|---|---|---|---|---|---|---|---|---|
| | | Yellow | Magenta | Cyan | Yellow | Magenta | Cyan | | |
| 1 (Invention A) | ○ | 1.62 | 1.62 | 1.67 | 2.12 | 2.16 | 2.13 | ○ | ○ |
| 2 (Invention B) | ○ | 1.43 | 1.51 | 1.52 | 2.09 | 2.22 | 2.21 | ○ | ○ |
| 3 (Comparison) | ○ | 1.85 | 1.85 | 1.91 | 2.02 | 2.15 | 2.14 | X | ○ |
| 4 (Comparison) | Δ | 1.59 | 1.63 | 1.61 | 2.11 | 2.23 | 2.27 | ○ | Δ |

*1; shows the approximation between a printed matter and the hue of a halftone dot image in a coupler color developer.

As is obvious from Table 1, Samples A and B of the invention were proved to be low in monochromatic densities, excellent in color reproducibility and black print ground, safe from any problem of processing speeds, equivalent to the current cost, and capable of assuring the high quality.

Example 2

Samples A, B and C each prepared in Example 1 were each subjected to a scanning exposure to the following light sources and thereafter they were each developed in the same manner as in Example 1.

Blue light He-Cd gas-laser (441.6 nm)
Green light He-Ne gas-laser (543.5 nm)
Red light He-Ne gas-laser (632.8 nm)

The results of the monochromatic densities, halftone dot reproducibilities, black print densities and so forth each obtained therefrom were evaluated in the same manners as in Example 1.

Particularly, Samples A and B were each proved to be lower in monochromatic density and more approximate to printed matters, as compared to comparative sample C.

Example 3

In this example, the following emulsions for color print paper use were prepared and were then coated over a support to arrange a red-sensitive emulsion layer, intermediate layer 1, a green-sensitive emulsion layer, a yellow filter layer, a blue-sensitive emulsion layer and a protective layer in this order. (This example is hereinafter referred to as 3A).

(a) Red-sensitive emulsion layer

In a neutral conversion process, one mol of silver iodochlorobromide emulsion comprising 0.7 mol % of silver iodide and 70 mol % of silver bromide and having an average grain size of 0.4μ was prepared. After precipitating and washing it, hypo and gold thiocyanate complex were so added as to make the secondary ripening treatment and sensitizing dyes D-1 and D-2 were then added thereto. Further, stabilizers T-1 and T-2, surfactant S-2 and cyan dye CD-1 were each added thereto. After that, gelatin was added thereto, and the resulting emulsion was coated so that the silver coating weight could be 0.5 g/m² and cyan dye CD-1 could also be 0.01 g/m².

(b) Intermediate layer 1

A gelatin solution containing surfactant S-2 and layer hardener H-1 was prepared and was then coated so that the gelatin coated amount could be 1.5 g/m².

(c) Green-sensitive emulsion layer

In a neutral conversion process, one mol of silver iodochlorobromide emulsion comprising 0.6 mol % of silver iodide and 70 mol % of silver bromide and having an average grain size of 0.51μ was prepared. After precipitating and washing it, hypo and gold thiocyanate complex were so added as to make the secondary ripening treatment and sensitizing dye D-3 was then added thereto. Further, stabilizers T-1 and T-2, surfactant S-2 and magenta dye MD-1 were each added thereto. After that, gelatin was added thereto, and the resulting emulsion was coated so that the silver coating weight could be 0.55 g/m² and magenta dye MD-1 could also be 0.011 g/m².

(d) Yellow filter layer

A gelatin solution containing surfactant S-2, layer hardener H-1 and yellow colloidal silver was prepared and was then coated so that the silver coated weight could be 0.13 g/m².

(e) Blue-sensitive emulsion layer

In a conversion process, one mol of silver iodobromide emulsion comprising 1.6 mol % of silver iodide and having an average grain size of 0.7µ was prepared. After precipitating and washing it, hypo and gold thiocyanate complex were so added as to make the secondary ripening treatment and sensitizing dye D-5 was then added thereto.

Stabilizers T-1 and T-3, surfactant S-2, yellow dye YD-1, layer hardener H-1 and gelatin were each added thereto. The resulting emulsion was coated so that the silver coated weight could be 0.7 g/m².

(f) Protective layer

A gelatin solution containing surfactant S-2 and layer hardener H-1 was prepared and was then coated so that the gelating coated amount could be 1.5 g/m².

The chemical structures of CD-1, MD-1 and YD-1 each used in the above-mentioned layers were as follows.

The compositions of the processing solutions were as follows.

| <Developer> | |
|---|---|
| Hydroquinone | 6.0 (g) |
| 1-phenyl-3-pyrazolidone | 0.5 |
| KBr | 2.0 |
| NaOH (85%) | 30.0 |
| Potassium pyrosulfite | 26.0 |
| Boric acid | 16.0 |
| Ammonium ethylenediamine tetraacetate | 2.0 |
| Ascorbic acid | 10.0 |
| Benztriazole | 0.5 |
| Ethylene glycol monoethyl ether | 60.5 |
| Water to make in total of | 1 liter |
| <Bleacher> | |
| Sulfuric acid (96%) | 40.0 (g) |
| Sodium 3-nitrobenzene sulfonate | 6.0 |
| KI | 8.0 |
| 2,3,6-trimethyl quinoxaline | 2.0 |
| Acetic acid | 2.1 |
| 3-mercaptobutylic acid | 1.75 |
| Ethylene glycol monoethyl ether | 46.7 |
| Water to make in total of | 1 liter |
| <Fixer> | |
| Ammonium thiosulfate (98%) | 200 (g) |
| Potassium pyrosulfite | 25 |
| NaOH (85%) | 110 |
| Water to make in total of | 1 liter |

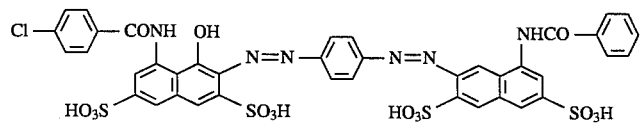

CD-1

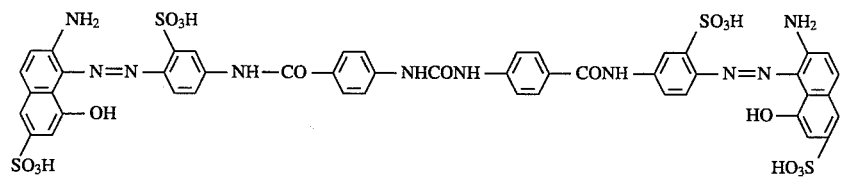

MD-1

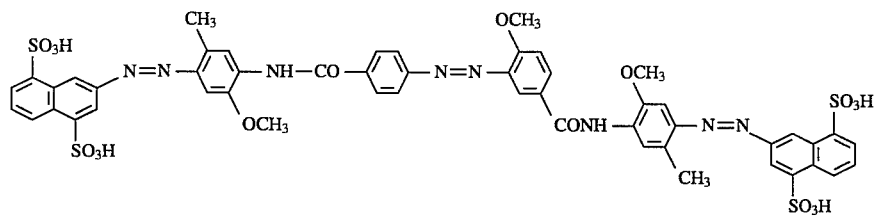

YD-1

The processing steps were carried out as follows.

| Processing steps | | |
|---|---|---|
| Developing | 20° C. | 3 min. |
| Washing | 20° C. | 30 sec. |
| Bleaching | 20° C. | 3 min. |
| Washing | 20° C. | 30 sec. |
| Fixing | 20° C. | 30 sec. |
| Washing Drying | 20° C. | 30 sec. |

This comparative emulsion was coated on the blue-sensitive layer in a 30% amount thereof, instead it was previously coated on the green-sensitive layer. (This example is hereinafter referred to as 3B).

The resulting two kinds of the light sensitive material were each subjected to the above-mentioned treatments. The resulting densities and density tones thereof were compared.

It was possible to make magenta tone density lower and to obtain the characteristics approximate to printed matters.

Now, one of the preferable embodiments of the invention will be detailed by citing the typical drawing 1 attached hereto.

In the yellow layer. a blue-sensitive emulsion and an emulsion sensitive to blue, green and red are each contained.

In the magenta layer. a green-sensitive emulsion and an emulsion sensitive to blue, green and red are each contained.

In the cyan layer. a red-sensitive emulsion and an emulsion sensitive to blue, green and red are each contained.

FIG. 1 shows each of the spectral sensitivities which are the embodiments of the invention.

What is claimed is:

1. An image forming method for a positive silver halide color light sensitive photographic material, said material comprising a support having thereon a mainly yellow image forming layer containing a first silver halide emulsion having a main spectral sensitivity at a first spectral sensitivity wavelength region, a mainly magenta image forming layer containing a second silver halide emulsion having a main spectral sensitivity at a second spectral sensitivity wavelength region, and a mainly cyan image forming layer containing a third silver halide emulsion having a main spectral sensitivity at a third spectral sensitivity wavelength region, wherein said first, second and third spectral sensitivity wavelength regions are different from each other, and at least one of said mainly yellow, magenta or cyan image forming layers further comprises a fourth emulsion having a spectral sensitivity at said first, second and third spectral sensitivity wavelength regions and each of said first, second and third emulsions has a sensitivity of 1/10 to 10 times the sensitivity of said fourth emulsion upon exposure to light having a wavelength within said first, second and third spectral sensitivity regions, respectively;

said method comprising the steps of:

exposing said material to light having a wavelength within said first spectral sensitivity wavelength region, exposing said material to light having a wavelength within said second spectral sensitivity wavelength region, exposing said material to light having a wavelength within said third spectral sensitivity wavelength region, and thereafter developing said material.

2. The image forming method of claim 1, wherein said material is prepared by mixing said first, second or third silver halide emulsion with said fourth emulsion for applying a coating solution, and coating said coating solution immediately after said mixing.

3. The image forming method of claim 1, wherein each of said mainly yellow, magenta and cyan image forming layers comprises said fourth emulsion.

4. The image forming method of claim 1, wherein said fourth emulsion is sensitized with at least three kinds of sensitizing dyes which provide sensitivity at said first, second and third spectral sensitivity wavelength regions.

5. The image forming method of claim 1, wherein said first emulsion is sensitized with a first sensitizing dye, said second emulsion is sensitized with a second sensitizing dye, said third emulsion is sensitized with a third sensitizing dye and said fourth emulsion is sensitized with said first, second and third sensitizing dyes.

6. The image forming method of claim 1, wherein said mainly yellow image forming layer comprises a yellow coupler represented by Formula Y-1:

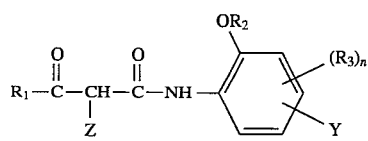

wherein $R_1$ represents an alkyl group or a cycloalkyl group; $R_2$ represents an alkyl group, a cycloalkyl group, an acyl group or an aryl group; $R_3$ represents a group capable of being substituted to a benzene ring; n is an integer of 0 or 1; Y represents a monovalent ballast group; and Z represents a hydrogen atom or a group capable of splitting off when making a coupling reaction.

7. The image forming method of claim 1, wherein said mainly magenta forming layer comprises a magenta coupler represented by Formula M-1:

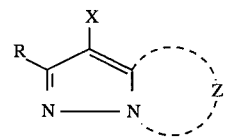

wherein Z represents a group consisting of non-metal atoms necessary to form a nitrogen-containing heterocyclic ring, provided that the ring formed of the above-mentioned Z may also have a substituent; X represents a hydrogen atom or a group capable of splitting off upon making a reaction with the oxidized products of a color developing agent; and R represents a hydrogen atom or a substituent.

8. The image forming method of claim 1, wherein said first spectral sensitivity wavelength region is a blue-light region, said second spectral sensitivity wavelength region is a green-light region and said third spectral sensitivity wavelength region is a red-light region.

9. The image forming method of claim 6, wherein said $R_3$, of said yellow coupler represented by Formula Y-I represents a hydrogen atom.

10. The image forming method of claim 7, wherein said mainly magenta coupler is represented by Formula M-2 or Formula M-3:

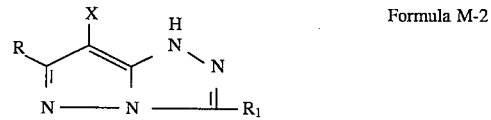

Formula M-2

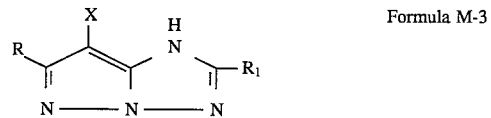

Formula M-3 wherein X represents a hydrogen atom or a group capable of splitting off upon making a reaction with the oxidized products of a color developing agent; and R represents an alkyl, an aryl, an anilino, an acylamino, a sulfonamido, an alkylthio, an arylthio, an alkenylthio, a cycloalkyl, a halogen atom, a cycloalkenyl, an alkinyl, a heterocyclicsulfonyl, a sulfinyl, a phosphonyl, an acyl, a carbamoyl, a sulfamoyl, a cyano, an alkoxy, an aryloxy, an heterocyclicoxy, a siloxy, an acyloxy, a carboamoyloxy, an amino, an alkylamino, an imino, a ureido, a sulfamoylamino, an alkoxycarbonylamino, an alkoxycarbonyl, an aryloxycarbonyl, a heterocyclicthio, a spiro-compound residual group or a cross-linked hydrocarbon compound residual group; and $R_1$ represents a substituent.

11. The image forming method of claim 6, wherein said $R^3$ of said yellow coupler represented by Formula Y-I is selected from the group consisting of:
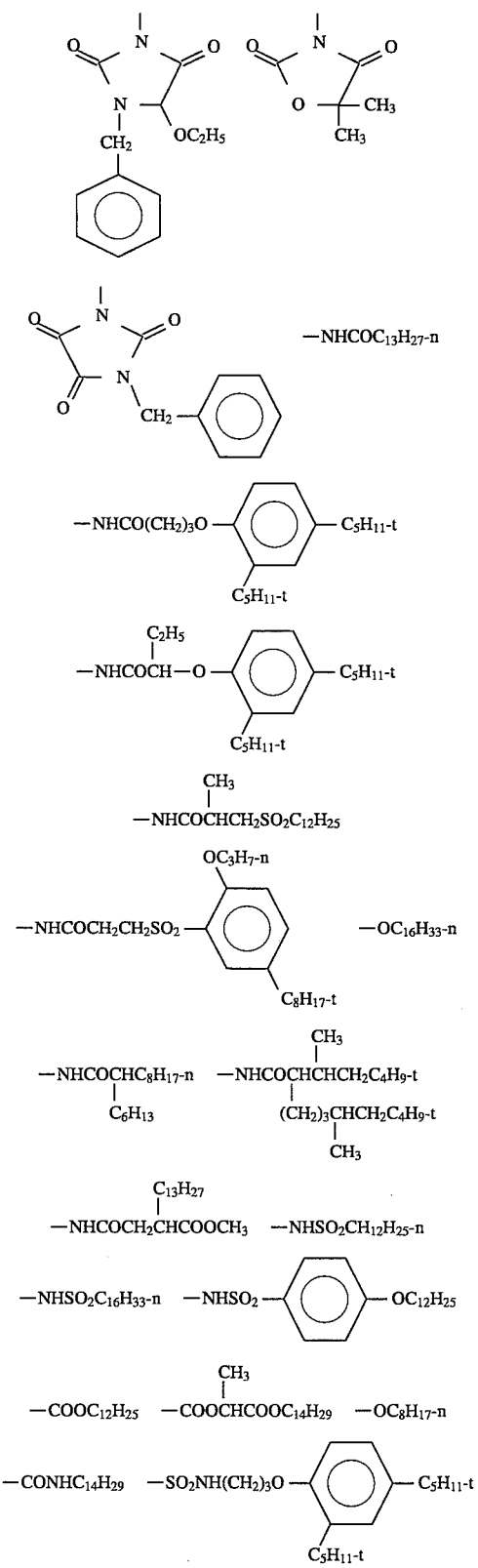
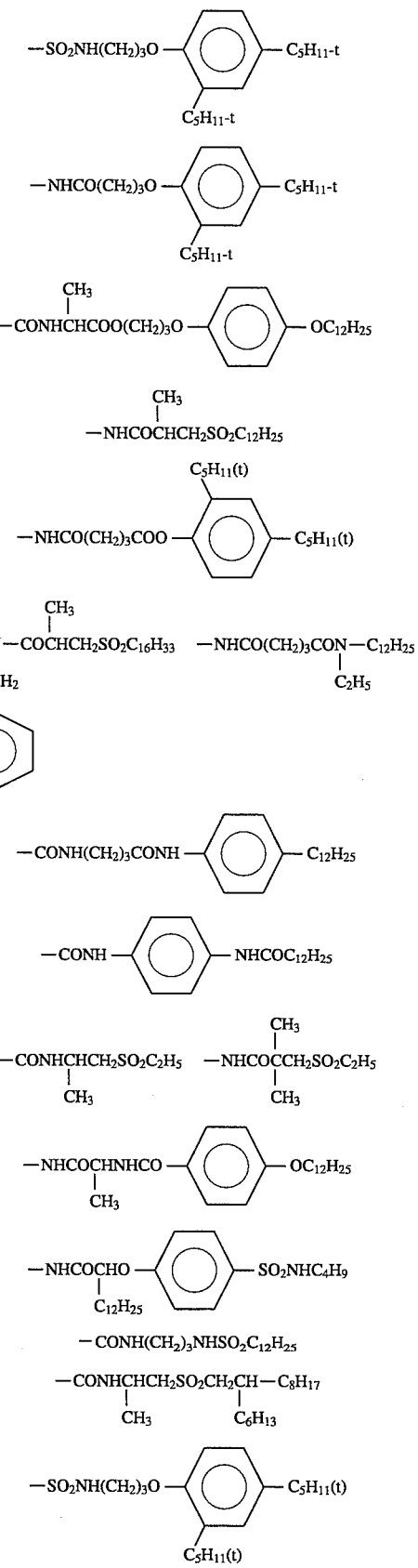

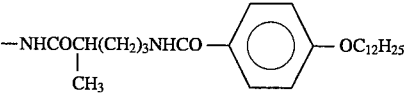

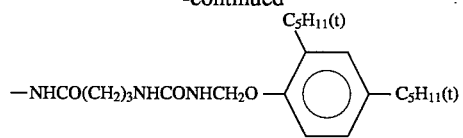
—SO₂NHCOC₂H₅   —NHCOCHCH₂SO₂C₁₂H₂₅
                      |
                      CH₃
—NHCOCHCH₂SO₂C₁₄H₂₉   —SO₂NHCOC₄H₉
       |
       CH₃
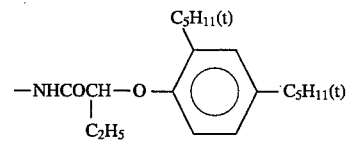
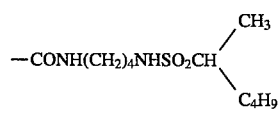
and
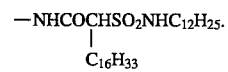
* * * * *